US009122362B2

(12) United States Patent
Park et al.

(10) Patent No.: US 9,122,362 B2
(45) Date of Patent: Sep. 1, 2015

(54) TOUCH PANELS AND DISPLAY DEVICES HAVING TOUCH PANELS

(75) Inventors: Jung-Mok Park, Yongin-si (KR); Kwan-Young Han, Yongin-si (KR); Tae-Hyeog Jung, Yongin-si (KR); Sung-Ku Kang, Yongin-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 278 days.

(21) Appl. No.: 13/495,413

(22) Filed: Jun. 13, 2012

(65) Prior Publication Data
US 2013/0194205 A1    Aug. 1, 2013

(30) Foreign Application Priority Data

Jan. 30, 2012    (KR) ........................ 10-2012-0008847

(51) Int. Cl.
*G02F 1/1335*    (2006.01)
*G06F 3/044*    (2006.01)
*G06F 3/041*    (2006.01)
(Continued)

(52) U.S. Cl.
CPC ...... *G06F 3/044* (2013.01); *G06F 2203/04103* (2013.01); *G06F 2203/04112* (2013.01); *H01L 27/323* (2013.01)

(58) Field of Classification Search
CPC ................ G02F 1/13338; G02F 2001/133638; G02F 1/133528; G02F 1/13362; G02F 2001/133543; G02F 2001/133541; G02F 1/0136; G02F 1/133533; G02F 1/13363; G02F 1/133634; G02F 2202/40; G02F 2413/02; G02F 2413/12; G02F 1/1395; G02B 5/3025; G02B 27/286; G02B 6/0056; G02B 5/30; G02B 27/28; G06F 3/044; G06F 3/041; G06F 3/0488; G06F 3/0412; G06F 2203/04808; G06F 3/0421; G06F 3/0414; G06F 2203/04104; G06F 2203/04103; G06F 2203/04106; G06F 1/1601; G06F 3/14; G06F 3/0227; G06F 1/1658; G06F 3/045; G06F 3/03547; G06F 3/042; G06F 1/1643; G06F 3/046; G06F 3/0304
See application file for complete search history.

(56) References Cited

U.S. PATENT DOCUMENTS 7,268,770 B1 *    9/2007    Takahata et al. .............. 345/173
7,405,774 B2      7/2008    Cho et al.
(Continued)

FOREIGN PATENT DOCUMENTS

KR    1998-053666 A    9/1998
KR    10-2004-0017138 A    2/2004
(Continued)

OTHER PUBLICATIONS

The extended European search report dated Feb. 6, 2015 of corresponding European Patent No. 12185325.3.

*Primary Examiner* — Bumsuk Won
*Assistant Examiner* — Angela Davison
(74) *Attorney, Agent, or Firm* — Robert E. Bushnell, Esq.

(57) ABSTRACT

A display device including a touch panel arranged on a display panel, the touch panel including at least one phase retardation layer, a polarization plate arranged on the at least one phase retardation layer, a touch sensing structure including at least one sensing pattern arranged directly on at least one of at least one face of the phase retardation layer and at least one face of the polarization plate, an adhesion layer arranged on the polarization plate and a window arranged on the adhesion layer.

5 Claims, 12 Drawing Sheets

(51) Int. Cl.
  *G02B 5/30* (2006.01)
  *G02B 27/28* (2006.01)
  *H01L 27/32* (2006.01)

(56) References Cited

U.S. PATENT DOCUMENTS

| | | |
|---|---|---|
| 7,583,326 B2 | 9/2009 | Cho et al. |
| 7,833,588 B2 * | 11/2010 | Mikoshiba et al. ............ 428/1.1 |
| 8,040,442 B2 | 10/2011 | Cho et al. |
| 2008/0246904 A1 * | 10/2008 | Cho et al. ........................ 349/96 |
| 2009/0002580 A1 | 1/2009 | Matsushima et al. |
| 2009/0015761 A1 * | 1/2009 | Stockham ....................... 349/96 |
| 2010/0066650 A1 * | 3/2010 | Lee et al. ........................ 345/64 |
| 2010/0134448 A1 | 6/2010 | Park et al. |
| 2010/0182252 A1 | 7/2010 | Jeong et al. |
| 2011/0216037 A1 * | 9/2011 | Kang et al. .................... 345/174 |

FOREIGN PATENT DOCUMENTS

| | | |
|---|---|---|
| KR | 10-0917011 | 9/2009 |
| KR | 10-1022065 | 3/2011 |
| KR | 10-2011-0039088 | 4/2011 |
| KR | 10-1029287 | 4/2011 |
| WO | 2010102491 A1 | 9/2010 |
| WO | 2011105221 A1 | 9/2011 |

* cited by examiner

TOUCH PANELS AND DISPLAY DEVICES HAVING TOUCH PANELS

CLAIM OF PRIORITY

This application makes reference to, incorporates the same herein, and claims all benefits accruing under 35 U.S.C. §119 from an application earlier filed in the Korean Intellectual Property Office on the 30 of Jan. 2012 and there duly assigned Serial No. 10-2012-0008847.

BACKGROUND OF THE INVENTION

1. Field of the Invention

Example embodiments of the invention relate to touch panels including touch sensing structures directly provided on phase retardation layers and/or polarization plates, and display devices having touch panels including touch sensing structures.

2. Description of the Related Art

A touch screen panel (TSP) employed in a display device such as an organic light emitting display (OLED) device or a liquid crystal display (LCD) device may generally recognize a contact position by the hand of a user or an object though touch sensors thereof. A recent display device may usually include such touch screen panel attached to a display panel.

The conventional touch panel may include indium tin oxide (ITO) patterns, a phase retardation layer, a polarization layer and adhesion layers so as to achieve relatively high optical transmittance thereof. For example, Korean Patent Application Publication No. 2011-0039088 discloses a touch panel that has adhesion layers, conductive films (patterned ITO layers) serving as touch sensors, a phase retardation layer and a polarization plate, which is disposed on a display panel. However, the conventional touch panel includes the polarization plate, the phase retardation plate, a base film and the touch sensors separately stacked on the display panel, so that the conventional touch panel may not have a small thickness. Thus, the conventional display device may not ensure a desired slim thickness. Further, the manufacturing costs for the conventional display device may be increased and also the yield of the manufacturing processes for the conventional display device may be reduced.

SUMMARY OF THE INVENTION

Example embodiments provide a touch panel having a touch sensing structure directly disposed on a phase retardation layer and/or a polarization plate to reduce optical loss and thickness thereof.

Example embodiments provide a display device including a touch sensing structure directly disposed on a phase retardation layer and/or a polarization plate to reduce optical loss and thickness thereof.

According to one aspect of example embodiments, there is provided a touch panel including at least one phase retardation layer, a polarization plate arranged on the at least one phase retardation layer, a touch sensing structure including at least one sensing pattern arranged directly on at least one of at least one face of the phase retardation layer and at least one face of the polarization plate, an adhesion layer arranged on the polarization plate; and a window arranged on the adhesion layer. The at least one sensing pattern may include a first sensing pattern arranged directly on a bottom face of the phase retardation layer; and a second sensing pattern arranged directly on an upper face of the phase retardation layer. The first and the second sensing patterns respectively may extend along directions substantially perpendicular to each other, and the phase retardation layer may include a λ/4 phase retardation film.

The at least one sensing pattern may instead include a first sensing pattern arranged directly on a bottom face of the phase retardation layer and a second sensing pattern arranged directly on a bottom face of the polarization plate. The at least one sensing pattern may instead include a first sensing pattern arranged directly on an upper face of the phase retardation layer and a second sensing pattern arranged directly on a bottom face of the polarization plate. The at least one sensing pattern may instead include a first sensing pattern arranged directly on an upper face of the phase retardation layer and a second sensing pattern arranged directly on an upper face of the polarization plate. The at least one sensing pattern may instead include a first sensing pattern arranged directly on a bottom face of the phase retardation layer and a second sensing pattern arranged directly on an upper face of the polarization plate.

The at least one phase retardation layer may include a first phase retardation layer and a second phase retardation layer arranged on the first phase retardation layer. The first phase retardation layer may include a λ/4 phase retardation film and the second phase retardation layer may include a λ/2 phase retardation film. The at least one sensing pattern may include a first sensing pattern arranged directly on a bottom face of the first phase retardation layer and a second sensing pattern arranged directly on an upper face of the first phase retardation layer. The at least one sensing pattern may instead include a first sensing pattern arranged directly on a bottom face of the first phase retardation layer and a second sensing pattern arranged directly on a bottom face of the second phase retardation layer. The at least one sensing pattern may instead include a first sensing pattern arranged directly on a bottom face of the second phase retardation layer and a second sensing pattern arranged directly on an upper face of the second phase retardation layer. The at least one sensing pattern may instead include a first sensing pattern arranged directly on an upper face of the first phase retardation layer and a second sensing pattern arranged directly on a bottom face of the second phase retardation layer. The at least one sensing pattern may instead include a first sensing pattern arranged directly on a bottom face of the second phase retardation layer and a second sensing pattern arranged directly on a bottom face of the polarization plate. The at least one sensing pattern may instead include a first sensing pattern arranged directly on an upper face of the first phase retardation layer and a second sensing pattern arranged directly on a bottom face of the polarization plate. The at least one sensing pattern may instead include a first sensing pattern arranged directly on an upper face of the second phase retardation layer and a second sensing pattern arranged directly on a bottom face of the polarization plate. The at least one sensing pattern may instead include a first sensing pattern arranged directly on an upper face of the second phase retardation layer and a second sensing pattern arranged directly on an upper face of the polarization plate. The at least one sensing pattern may instead include a first sensing pattern arranged directly on a bottom face of the second phase retardation layer and a second sensing pattern arranged directly on an upper face of the polarization plate. The at least one sensing pattern may instead include a first sensing pattern arranged directly on a bottom face of the first phase retardation layer and a second sensing pattern arranged directly on an upper face of the polarization plate. The at least one sensing pattern may instead include a first sensing pattern arranged directly on an upper face of the first phase retardation layer and a second sensing pattern arranged directly on an upper face of the second phase retardation layer.

The at least one sensing pattern may instead include a sensing pattern arranged directly on an upper face of the second phase retardation layer. The at least one sensing pattern may instead include a sensing pattern arranged directly on a bottom face of the second phase retardation layer. The at least one sensing pattern may instead include a sensing pattern arranged directly on an upper face of the first phase retardation layer. The phase retardation layer may include a $\lambda/4$ phase retardation film, and the touch sensing structure may include a sensing pattern arranged directly on an upper face of the phase retardation layer. The phase retardation layer may include a $\lambda/4$ phase retardation film, and the touch sensing structure may include the at least one sensing pattern arranged directly on a bottom face the phase retardation layer.

According to another aspect of the present invention, there is provided a display device that includes a touch panel arranged on a display panel, the touch panel including at least one phase retardation layer, a polarization plate arranged on the at least one phase retardation layer, a touch sensing structure including at least one sensing pattern arranged directly on a face of one of the at least phase retardation layer and on a face of the polarization plate, an adhesion layer arranged on the polarization plate and a window arranged on the adhesion layer. The at least one phase retardation layer may include a first phase retardation layer having a $\lambda/4$ phase retardation film and a second phase retardation layer having a $\lambda/2$ phase retardation film, the second phase retardation layer being arranged on the first phase retardation layer.

The at least one sensing pattern may include a first sensing pattern arranged directly on a bottom face of the first phase retardation layer and a second sensing pattern arranged directly on an upper face of the first phase retardation layer. The at least one sensing pattern may instead include a first sensing pattern arranged directly on a bottom face of the first phase retardation layer and a second sensing pattern arranged directly on a bottom face of the second phase retardation layer. The at least one sensing pattern may instead include a first sensing pattern arranged directly on an upper face of the second phase retardation layer and a second sensing pattern arranged directly on an upper face of the polarization plate. The at least one sensing pattern may instead include a first sensing pattern arranged directly on an upper face of the second phase retardation layer and a second sensing pattern arranged directly on a bottom face of the polarization plate. The at least one sensing pattern may instead include a first sensing pattern arranged directly on a bottom face of the second phase retardation layer and a second sensing pattern arranged directly on an upper face of the polarization plate. The at least one sensing pattern may instead include a first sensing pattern arranged directly on an upper face of the first phase retardation layer and a second sensing pattern arranged directly on an upper face of the polarization plate. The at least one sensing pattern may instead include a first sensing pattern arranged directly on a bottom face of the first phase retardation layer and a second sensing pattern arranged directly on a bottom face of the second phase retardation layer. The at least one sensing pattern may instead include a first sensing pattern arranged directly on an upper face of the phase retardation layer and a second sensing pattern arranged directly on an upper face of the polarization plate. The at least one sensing pattern may instead include a first sensing pattern arranged directly on a bottom face of the phase retardation layer and a second sensing pattern arranged directly on a bottom face of the polarization plate. The at least one sensing pattern may instead include a first sensing pattern arranged directly on a bottom face of the phase retardation layer and a second sensing pattern arranged directly on an upper face of the polarization plate.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
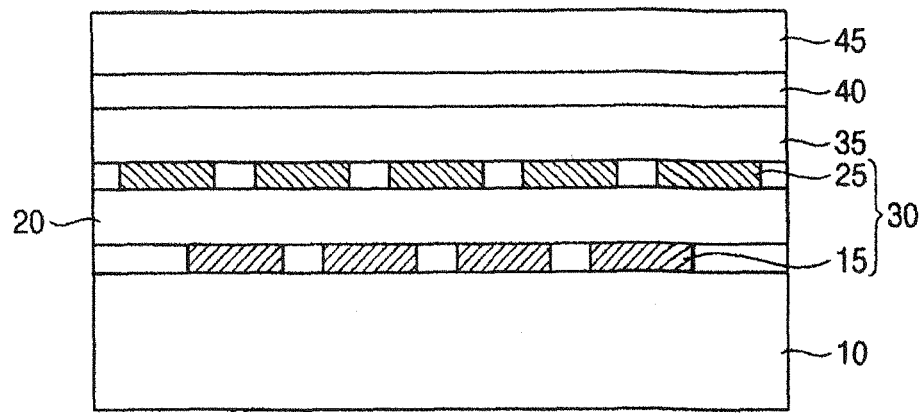
FIG. 1 is a cross sectional view illustrating a display device including a touch panel in accordance with example embodiments.

The example embodiments are described more fully hereinafter with reference to the accompanying drawings. The invention may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross sectional illustrations that are schematic illustrations of illustratively idealized example embodiments (and intermediate structures) of the invention. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
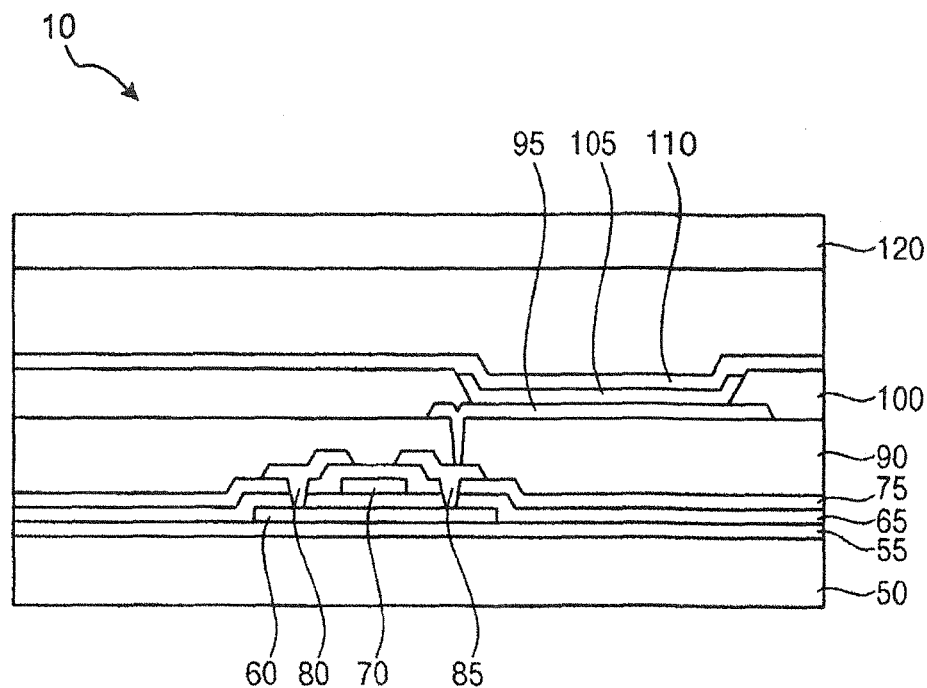
FIG. 2 is a cross sectional view illustrating a display panel of a display device in accordance with example embodiments.

FIG. 1 is a cross sectional view illustrating a display device including a touch panel in accordance with example embodiments. FIG. 2 is a cross sectional view illustrating a display panel of a display device in accordance with example embodiments.

Referring to FIG. 1, the display device may include a display panel 10 and a touch panel disposed on the display panel 10. In example embodiments, the touch panel may have a phase retardation layer 20, a touch sensing structure 30, a polarization plate 35, an adhesion layer 40, a window 45, etc. The touch sensing structure 30 may include a first sensing pattern 15 and a second sensing pattern 25.

In some example embodiments, an additional adhesion layer (not illustrated) may be disposed between the display panel 10 and the touch panel to increase bonding strength between the display panel 10 and the touch panel.

Referring to FIGS. 1 and 2, the display panel 10 may include a first substrate 50, a switching device, a first electrode 95, a light emitting structure 105, a second electrode 110, a second substrate 120, etc.

A buffer layer 55 may be disposed on the first substrate 50. The first substrate 50 may include a transparent insulation substrate. For example, the first substrate 50 may include a glass substrate, a quartz substrate, a transparent resin substrate, etc. Examples of the transparent resin substrate for the first substrate 50 may include polyimide-based resin, acryl-based resin, polyacrylate-based resin, polycarbonate-based resin, polyether-based resin, sulfonic acid containing resin, polyethyleneterephthalate-based resin, etc.

In example embodiments, the buffer layer 55 may prevent diffusion of metal atoms and/or impurities from the first substrate 50. Additionally, the buffer layer 55 may adjust heat transfer rate of a successive crystallization process for an active layer 60, to thereby obtaining a substantially uniform active layer 60. In case that the first substrate 50 may have a relatively irregular surface, the buffer layer 55 may improve flatness of the surface of the first substrate 50. The buffer layer 55 may be formed using a silicon compound. For example, the buffer layer 55 may include silicon oxide (SiOx), silicon nitride (SiNx), silicon oxynitride (SiOxNy), silicon oxycarbide (SiOxCy), silicon carbon nitride (SiCxNy), etc. These may be used alone or in a mixture thereof. The buffer layer 55 may be obtained on the first substrate 50 by a spin coating process, a chemical vapor deposition (CVD) process, a plasma enhanced chemical vapor deposition (PECVD) process, a high density plasma-chemical vapor deposition (HDP-CVD) process, a printing process, etc. The buffer layer 55 may be a single layer structure or a multi-layered structure. For example, the buffer layer 55—may have a single-layered structure including a silicon oxide film, a silicon nitride film, a silicon oxynitride film, a silicon oxycarbide film or a silicon carbon nitride film. Alternatively, the buffer layer 55 may have a multilayered structure including at, least two of a silicon oxide film, a silicon nitride film, a silicon oxynitride film, a silicon oxycarbide film, a silicon carbon nitride film, etc. In some example embodiments, the buffer layer 55 may not be formed on the first substrate 50 in accordance with materials and/or surface conditions of the first substrate 50.

The switching device may be provided on the buffer layer 55. In example embodiments, the switching device may include a thin film transistor (TFT) having the active layer 60 that may contain silicon (Si). Here, the switching device may include the active layer 60, a gate insulation layer 65, a gate electrode 70, a source electrode 80, a drain electrode 85, etc. In some example embodiments, the switching device may include an oxide semiconductor device having an active layer that may contain semiconductor oxides.

When the switching device includes the TFT, the active layer may be disposed on the buffer layer 55. The active layer 60 may have a source region and a drain region both of which are doped with impurities. The active layer 60 may additionally include a channel region provided between the source region and the drain region.

In example embodiments, a semiconductor layer (not illustrated) may be formed on the buffer layer 55, and then a preliminary active layer (not illustrated) may be formed on the buffer layer 55 by patterning the semiconductor layer. The crystallization process may be performed about the preliminary active layer to form the active layer 60 on the buffer layer 55. Here, the semiconductor layer may be formed by a CVD process, a PECVD process, a low pressure chemical vapor deposition (LPCVD) process, a sputtering process, a printing process, etc. When the semiconductor layer includes amorphous silicon, the active layer 60 may include polysilicon. The crystallization process for forming the active layer 60 may include a laser irradiation process, a thermal treatment process, a thermal process utilizing a catalyst, etc.

In some example embodiments, a dehydrogenation process may be performed about the semiconductor layer and/or the preliminary active layer after forming the semiconductor layer and/or the preliminary active layer on the buffer layer 55. The dehydrogenation process may reduce the hydrogen concentration of the semiconductor layer and/or the preliminary active layer, so that the active layer 60 may ensure improved electrical characteristics.

The gate insulation layer 65 may be disposed on the buffer layer 55 to cover the active layer 60. The gate insulation layer 65 may be formed by a CVD process, a spin coating process, a PECVD process, a sputtering process, a vacuum evaporation process, an HDP-CVD process, a printing process, etc. The gate insulation layer 65 may include silicon oxide, metal oxide, etc. Examples of metal oxide in the gate insulation layer 65 may include hafnium oxide (HfOx), aluminum oxide (AlOx), zirconium oxide (ZrOx), titanium oxide (TiOx), tantalum oxide (TaOx), etc. These may be used alone or in a combination thereof. In example embodiments, the gate insulation layer 65 may be uniformly formed on the buffer layer 55 along a profile of the active layer 60. Here, the gate insulation layer 65 may have a substantially small thickness, such that a stepped portion may be generated at a portion of the gate insulation layer 65 adjacent to the active layer 60. In some example embodiments, the gate insulation layer 65 may have a relatively large thickness for sufficiently covering the active layer 60, so that the gate insulation layer 65 may have a substantially level surface.

The gate electrode 70 may be located on the gate insulation layer 65. For example, the gate electrode 70 may be positioned on a portion of the gate insulation layer 65 under which the active layer 60 is located. In example embodiments, a first conductive layer (not illustrated) may be formed on the gate insulation layer 65, and then the first conductive layer may be partially etched by a photolithography process or an etching process using an additional etching mask. Hence, the gate electrode 70 may be provided on the gate insulation layer 65. The first conductive layer may be formed by a printing process, a sputtering process, a CVD process, a pulsed laser deposition (PLD) process, a vacuum evaporation process, an atomic layer deposition (ALD) process, etc. The gate electrode 70 may include metal, alloy, conductive metal oxide, a transparent conductive material, etc. For example, the gate electrode 70 may be formed using aluminum (Al), alloy containing aluminum, aluminum nitride (AlNx), silver (Ag), alloy containing silver, tungsten (W), tungsten nitride (WNx), copper (Cu), alloy containing copper, nickel (Ni), alloy containing nickel, chrome (Cr), chrome nitride (CrNx), molybdenum (Mo), alloy containing molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), indium tin oxide (ITO), tin oxide (SnOx), indium oxide (InOx), gallium oxide (GaOx), indium zinc oxide (IZO), etc. These may be used alone or in a combination thereof. In example embodiments, the gate electrode 70 may have a single layer structure or a multi layer structure, which may include a metal film, an alloy film, a metal nitride film, a conductive metal oxide film and/or a transparent conductive film.

Although it is now illustrated, a gate line may be formed on the gate insulation layer 65 while forming the gate electrode 70 on the gate insulation layer 65. The gate electrode 70 may make contact with the gate line, and the gate line may extend on the gate insulation layer 65 along a first direction.

An insulating interlayer 75 may be disposed on the gate insulation layer 65 to cover the gate electrode 70. The insulating interlayer 75 may electrically insulate the source and the drain electrodes 80 and 85 from the gate electrode 70. The insulating interlayer 75 having a substantially uniform thickness may be conformally formed on the gate insulation layer 65 along a profile of the gate electrode 70. Thus, a stepped portion may be generated at a portion of the insulating interlayer 75 adjacent to the gate electrode 70. The insulating interlayer 75 may be formed using a silicon compound. For example, the insulating interlayer 75 may include silicon oxide, silicon nitride, silicon oxynitride, silicon oxycarbide and/or silicon carbon nitride. These may be used alone or in a mixture thereof. The insulating interlayer 75 may be obtained by a spin coating process, a CVD process, a PECVD process, an HDP-CVD process, an LPCVD process, etc. In example embodiments, the insulating interlayer 75 may have a single layer structure or a multi layer structure, which may include a silicon oxide film, a silicon nitride film, a silicon oxynitride film, a silicon oxycarbide film and/or a silicon carbon nitride film.

As illustrated in FIG. 2, the source electrode 80 and the drain electrode 85 may be disposed on the insulating interlayer 75. The source and the drain electrodes 80 and 85 may be separated each other by a predetermined distance substantially centering the gate electrode 75. The source and the drain electrodes 80 and 85 may pass through the insulating interlayer 75, and may contact the source and the drain regions of the active layer 60, respectively. In example embodiments, the insulating interlayer 75 may be partially etched to form contact holes exposing the source and the drain regions, respectively. Then, a second conductive layer (not illustrated) may be formed on the insulating interlayer 75 to fill the contact holes. The second conductive layer may be removed until the insulating interlayer 75 is exposed, so that the source and the drain electrodes 80 and 85 may be formed on the source and the drain regions, respectively. The second conductive layer may be obtained by a sputtering process, a CVD process, a PLD process, a vacuum evaporation process, an ALD process, a printing process, etc. Each of the source and the drain electrodes 80 and 85 may include metal, alloy, metal nitride, conductive metal oxide, a transparent conductive material, etc. For example, the source and the drain electrodes 80 and 85 may be formed using aluminum, alloy containing aluminum, aluminum nitride, silver, alloy containing silver, tungsten, tungsten nitride, copper, alloy containing copper, nickel, alloy containing nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These may be used alone or in a combination thereof. In example embodiments, each of the source and the drain electrodes 80 and 85 may have a single layer structure or a multi layer structure, which may include a metal film, an alloy film, a metal nitride film, a conductive metal oxide film and/or a transparent conductive film.

Although it is not illustrated in FIG. 2, a data line may be formed on the insulating interlayer 75 while forming the source and the drain electrodes 80 and 85. The data line may extend on the insulating interlayer 75 along a second direction. In this case, the second direction of the date line may be substantially perpendicular to the first direction of the gate line.

As the formation of the source and the drain electrodes 80 and 85 on the insulating interlayer 75, the switching device may be provided on the first substrate 50. The switching device may include the TFT that may have the active layer 60, the gate insulation layer 65, the gate electrode 75, the source electrode 80 and the drain electrode 85.

Referring now to FIG. 2, an insulation layer 90 may be disposed on the insulating interlayer 75. The insulation layer 90 may have a single-layered structure or a multi-layered structure including at least two insulation films. In example embodiments, a planarization process may be executed on the insulation layer 90 to enhance the flatness of the insulation layer 90. For example, the insulation layer 90 may have a substantially level surface by a chemical mechanical polishing (CMP) process, an etch-back process, etc. The insulation layer 90 may be formed using an organic material. For example, the insulation layer 90 may include photoresist, acryl-based resin, polyimide-based resin, polyamide-based resin, siloxane-based resin, etc. These may be used alone or in a combination thereof. Alternatively, the insulation layer 90 may include an inorganic material. For example, the insulation layer 90 may be formed using silicon oxide, silicon nitride, silicon oxynitride, silicon oxycarbide, aluminum, magnesium, zinc, hafnium, zirconium, titanium, tantalum, aluminum oxide, titanium oxide, tantalum oxide, magnesium oxide, zinc oxide, hafnium oxide, zirconium oxide, titanium oxide, etc. These may be used alone or in a mixture thereof. The insulation layer 90 may be obtained by a spin coating process, a printing process, a sputtering process, a CVD process, an ALD process, a PECVD process, an HDP-CVD process or a vacuum evaporation process in accordance with ingredients included in the insulation layer 90.

The insulation layer 90 may be partially etched by a photolithography process or an etching process using an additional etching mask such as a hard mask, so that a contact hole may be formed through the insulation layer 90. The contact hole may partially expose the drain electrode 85 of the switching device. In example embodiments, the contact hole may have a sidewall inclined by a predetermined angle relative to the first substrate 50. For example, the contact hole may have an upper width substantially larger than a lower width thereof.

The first electrode 95 may be disposed on the insulation layer 90 to fill the contact hole formed through the insulation layer 90. Thus, the first electrode 95 may make contact with the drain electrode 85 exposed by the contact hole. In some example embodiments, a contact, a plug or a pad may be formed in the contact hole, and then the first electrode 95 may be formed on the contact, the plug or the pad. Here, the first electrode 95 may be electrically connected to the drain electrode 85 through the contact, the plug or the pad.

The first electrode 95 may include a reflective material or a transmissive material in accordance with the emission type of the display device having the display panel 10 and the touch panel. For example, the first electrode 95 may be formed using aluminum, alloy containing aluminum, aluminum nitride, silver, alloy containing silver, tungsten, tungsten nitride, copper, alloy containing copper, nickel, alloy containing nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These may be used alone or in a combination thereof. The first electrode 95 may be obtained by a printing process, a sputtering process, a CVD process, an ALD process, a vacuum evaporation process, a PLD process, etc. In example embodiments, the first electrode 95 may have a single layer structure or a multi layer structure, which may include a metal film, an alloy film, a metal nitride film, a conductive metal oxide film and/or a transparent conductive film.

A pixel defining layer 100 may be disposed on the first electrode 95 and the insulation layer 90. The pixel defining layer 100 may include an organic material or an inorganic material. For example, the pixel defining layer 100 may be formed using photoresist, acryl-based resin, polyacryl-based resin, polyimide-based resin, a silicon compound, etc. The pixel defining layer 100 may be obtained by a spin coating process, a spray process, a printing process, a CVD process, a PECVD process, an HDP-CVD process, etc. In example embodiments, the pixel defining layer 100 may be partially etched to form an opening partially exposing the first electrode 95. The opening of the pixel defining layer 100 may define a luminescent region and a non-luminescent region of the display panel 10. For example, a portion of the display panel 10 having the opening of the pixel defining layer 100 may be the luminescent region of the display device while another portion of the display panel 10 around the opening of the pixel defining layer 100 may be the non-luminescent region of the display device.

The light emitting structure 105 may be positioned on the first electrode 95 exposed by the opening of the pixel defining layer 100. The light emitting structure 105 may extend on a sidewall of the opening of the pixel defining layer 100. The light emitting structure 105 may be formed by a laser induced thermal imaging process, a printing process, etc. The light emitting structure 105 may include an organic light emitting layer (EL), a hole injection layer (HIL), a hole transfer layer (HTL), an electron transfer layer (ETL), an electron injection layer (EIL), etc. In example embodiments, a plurality of organic light emitting layers may be formed using light emitting materials for generating different colors of light such as a red color of light (R), a green color of light (G) and a blue color of light (B) in accordance with color pixels of the display device. In some example embodiments, the organic light emitting layer of the of the light emitting structure 105 may include a plurality of stacked light emitting materials for generating a red color of light, a green color of light and a blue color of light to thereby emitting a white color of light.

The second electrode 110 may be disposed on the light emitting structure 105 and the pixel defining layer 100. The second electrode 100 may include a transmissive material or a reflective material in accordance with the emission type of the display device. For example, the second electrode 110 may be formed using aluminum, alloy containing aluminum, aluminum nitride, silver, alloy containing silver, tungsten, tungsten nitride, copper, alloy containing copper, nickel, alloy containing nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These may be used alone or in a combination thereof. Additionally, the second electrode 110 may be formed by a printing process, a sputtering process, a CVD process, an ALD process, a vacuum evaporation process, a PLD process, etc. In example embodiments, the second electrode 110 may also have a single layer structure or a multi layer structure, which may include a metal film, an alloy film, a metal nitride film, a conductive metal oxide film and/or a transparent conductive film.

The second substrate 120 may be positioned on the second electrode 110. The second substrate 120 may include a transparent insulation substrate. For example, the second substrate 120 may include a glass substrate, a quartz substrate, a transparent resin substrate, etc. In example embodiments, a predetermined space may be provided between the second electrode 110 and the second substrate 120. This space may be filled with an air or an inactive gas such as a nitrogen ($N_2$) gas.

In some example embodiments, a protection layer (not illustrated) may be additionally disposed between the second electrode 110 and the second substrate 120. Here, the protection layer may include a resin, for example, photoresist, acryl-based resin, polyimide-based resin, polyamide-based resin, siloxane-based resin, etc. These may be used or in a combination thereof.

Although the display device includes the display panel 10 such as an organic light emitting display (OLED) panel in FIG. 2, the display device may include other various display panels such as a liquid crystal display panel, an electrophoretic display panel, a plasma display panel, etc. That is, the touch panel according to example embodiments may be employed in various other display devices having a liquid crystal display panel, an electrophoretic display panel, a plasma display panel, etc.

Referring now to FIG. 1, the touch panel of the display device may be disposed on the display panel 10 such as the organic light emitting display panel, the liquid crystal display panel, the electrophoretic display panel, the plasma display panel, etc. The touch panel may include the phase retardation layer 20, the polarization plate 35, the adhesion layer 40, the window 45, etc. As described above, the additional adhesion layer may be interposed between the display panel 10 and the phase retardation layer 20 to increase combination strength between the display panel 10 and the touch panel. The additional adhesion layer may fill a space between the display panel 10 and the touch panel to thereby increase a contact area between the display panel 10 and the touch panel. Hence, the touch panel may be stably combined with the display panel 10. For example, the additional adhesion layer may include rubber-based adhesive, acryl-based adhesive, vinylether-based adhesive, silicon-based adhesive, urethane-based adhesive, etc. In some example embodiments, the additional adhesion layer may include a pressure sensitive adhesive, such that the adhesion strength between the display panel 10 and the touch panel may be more increased when a predetermined pressure is applied to the display panel 10 and/or the touch panel having the additional adhesion layer.

In example embodiments, the phase retardation layer 20 may includes a λ/4 phase retardation film. The λ/4 phase retardation film may assign a phase retardation of about λ/4 to two polarizing components crossing a substantially right angle and being substantially parallel to an optical axis of the phase retardation layer 20. Thus, the λ/4 phase retardation film may substantially convert a linear polarizing component of incident light into a circularly polarizing component of incident light or may change the circularly polarizing component into the linear polarizing component. That is, the phase retardation layer 20 may change a linear polarizing component of light emitted from the display panel 10 into a circularly polarizing component of light or may convert a circularly polarizing component of light emitted from the display panel 10 into the linear polarizing component. The phase retardation layer 20 may assign a predetermined retardation value to the polarizing components of incident light. For example, the phase retardation layer 20 may provide the polarizing components of incident light with a retardation value of about 100 nm to about 200 nm.

The phase retardation layer 20 may include a polymer birefringent film, a liquid crystal alignment film, a liquid crystal polymer alignment film formed on a base film, etc. For example, the phase retardation layer 20 may be formed using polycarbonate, polyvinylalcohol, polystyrene, polypropylene, polyolefine, polyarylate, polyamide, polymethylmethacrylate, polyethyleneterephthalate, triacetylcelluose, etc.

In example embodiments, the first and the second sensing patterns 15 and 25 may be directly disposed on opposite faces of the phase retardation layer 20, respectively. For example the first sensing pattern 15 of the touch sensing structure 30 may be directly formed on a first face of the phase retardation layer 20 (e.g., a bottom face of the phase retardation layer 20) while the second sensing pattern 25 may be directly formed on a second face of the phase retardation layer 20 (e.g., an upper face of the phase retardation layer 20). In some example embodiments, the first sensing pattern 15 may be positioned on the second face of the phase retardation layer 20 whereas the second sensing pattern 25 may be located on the first face of the phase retardation layer 20. In other example embodiments, the first sensing pattern 15 may be directly formed on the bottom face of the phase retardation layer 20, and the second sensing pattern 25 may be directly formed on a bottom face of the polarization plate 35.

Figure 3:
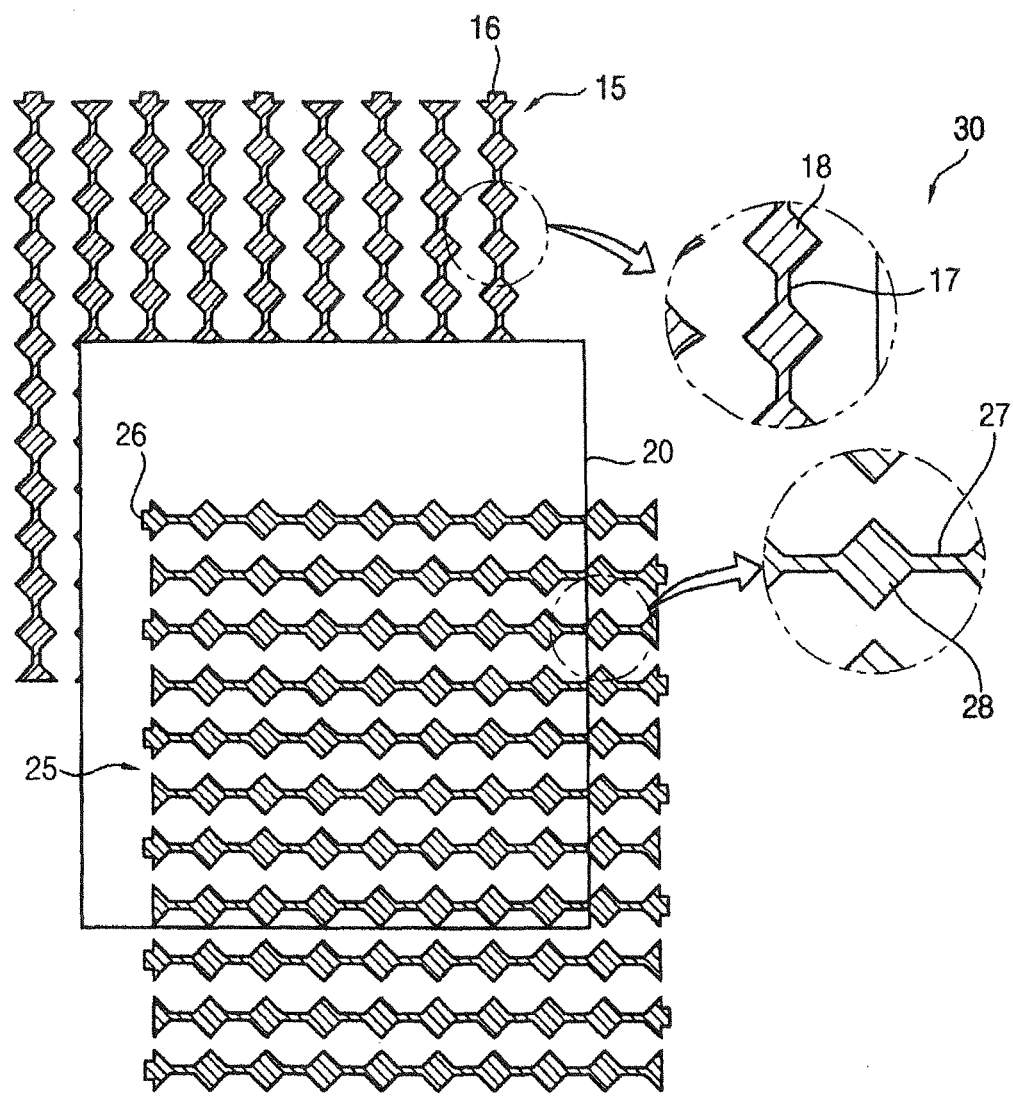
FIG. 3 is an exploded view illustrating a phase retardation layer and a touch sensing structure of a display device in accordance with example embodiments.

Turning now to FIG. 3, FIG. 3 is an exploded view illustrating the phase retardation layer 20 and the touch sensing structure 30 of the display device in accordance with example embodiments. Referring to FIGS. 1 and 3, the touch sensing structure 30 may include the first and the second sensing patterns 15 and 25 directly disposed on the first and the second faces of the phase retardation layer 20, respectively. In example embodiments, the first sensing pattern 15 may extend along a direction substantially different from a direction where the second sensing pattern 25 extends. For example, the first sensing pattern 15 may extend in a direction substantially perpendicular to a direction in which the second sensing pattern 25 extends.

As illustrated in FIG. 3, the first sensing pattern 15 may include first sensing cells 18, a plurality of first connecting portions 17 and a plurality of first pads 16. In example embodiments, each of the first sensing cells 18 may have a rhombus shape, a diamond shape, etc. Adjacent first sensing cells 18 may be connected to each other by one first connecting portion 17 interposed therebetween. In this manner, the plurality of first cells 18 may be connected to one another by interposing the plurality of first connecting portions 17 therebetween. The first sensing cells 18 may be regularly arranged on the first face of the phase retardation layer 20. The first connecting portions 17 may connect the first sensing cells 18 having the same x-coordinates or the same y-coordinates. In some example embodiments, each of the first sensing cells 18 may have various shapes such as a polygonal shape, a circular shape, an elliptical shape, a track shape, etc. The shapes of the first sensing cells 18 may mainly depend on the shape of the display panel 10 of the display device.

The first sensing pattern 15 may additionally the first pads 16. The first pads 16 may be electrically connected to the first sensing cells 18 by the row or by the column. Further, the first pads 16 may be disposed at an upper portion of the first face of the phase retardation layer 20 or a lower portion of the first face of the phase retardation layer 20 by the row or by the column. In some example embodiments, the first pads 16 may be formed on both of the upper and the lower portions of the phase retardation layer 20.

In example embodiments, the first sensing pattern 15 may include a transparent conductive material. For example, a first transparent conductive layer (not illustrated) may be formed on first face of the phase retardation layer 20, and then the first transparent conductive layer may be patterned, so that the first sensing pattern 15 having the above-described structure may be directly formed on the first face of the phase retardation layer 20. The first transparent conductive layer may be directly formed on the phase retardation layer 20 by a sputtering process, a printing process, a plating process, a PLD process, a vacuum evaporation process, etc. The first sensing pattern 15 may be obtained using indium tin oxide (ITO), zinc tin oxide (ZTO), gallium oxide, indium zinc oxide (IZO), zinc oxide, tin oxide, etc. These may be used alone or in a combination thereof. Further, the first sensing pattern 15 may have a single layer structure or a multi layer structure.

Referring now to FIG. 3, the second sensing pattern 25 may include a second sensing cells 28, a plurality of second connecting portions 27 and a plurality of second pads 26. In example embodiments, each of the second sensing cells 28 may also have a rhombus shape, a diamond shape, etc. The second connecting portions 27 may be disposed between adjacent second sensing cells 28. That is, adjacent second patterns 28 may be spaced apart from each other by a distance substantially the same as a width of one second connecting portion 27. In this manner, the second sensing cells 28 may be arranged on the second face of the phase retardation layer 20. The second sensing cells 28 may also regularly disposed on the second face of the phase retardation layer 20. Here, the second sensing cells 28 may be partially overlapped relative to the first sensing cells 18. Alternatively, the second sensing pattern 28 may not be substantially overlapped with respect to the first sensing pattern 18. For example, each of the first sensing cells 18 and each of the second sensing cells 28 may be alternately formed on the first face and the second face of the phase retardation layer 20, respectively.

The second connecting portions 27 may connect the second sensing cells 28 having the same x-coordinates or the same y-coordinates. That is, the second sensing cells 28 and the plurality of second connecting portions 27 may be arranged on the second face of the phase retardation layer 20 by the row or by the column. In some example embodiments, each of the second sensing cells 28 may have various shapes such as a polygonal shape, a circular shape, an elliptical shape, a track shape, etc. The second pads 26 of the second sensing pattern 25 may be connected to the second sensing cells 28 by the row or by the column. Namely, the second pads 26 may be disposed on a left portion of the second face of the phase retardation layer 20 or the right portion of the second face of the phase retardation layer 20 by the row. Alternatively, the second pads 26 may be formed both of the left and the right portions of the second face of the phase retardation layer 20.

According to example embodiments, the second sensing pattern 25 may be formed using a transparent conductive material. For example, a second transparent conductive layer (not illustrated) may be formed on the second face of the phase retardation layer 20. The second transparent conductive layer may be directly formed by a sputtering process, a printing process, a plating process, a PLD process, a vacuum evaporation process, etc. Then, the second transparent conductive layer may be patterned to directly form the second sensing pattern 25 having the above-described structure on the second face of the phase retardation layer 20. The second sensing pattern 25 may include indium tin oxide, zinc tin oxide, gallium oxide, indium zinc oxide, zinc oxide, tin oxide, etc. These may be used alone or in a combination thereof. Further, the first sensing pattern 15 may have a single layer structure or a multi layer structure.

In example embodiments, the second sensing pattern 25 may be formed using a transparent conductive material substantially the same as or substantially similar to those of the first sensing pattern 15. Alternatively, the transparent conductive material included in the second sensing pattern 25 may be different from that included in the first sensing pattern 15.

When a user or an object contacts the touch panel including the touch sensing structure 30 having the above-described configuration, a variation of electrostatic capacity at a contact position of the touch panel caused by the user or the object may be generated between related the first and the second sensing patterns 15 and 25, and then the variation of electrostatic capacity may be applied to a driving circuit (not illustrated) through the metal wiring (not illustrated), and a position detecting wiring (not illustrated). The variation of electrostatic capacity may be converted to an electrical signal by the driving circuit so that the contact position of the touch panel may be identified.

In some example embodiments, an additional protection layer (not illustrated) may be disposed on the phase retardation layer 20 and the second sensing pattern 25. The additional protection layer may be formed using a transparent insulation material.

According to example embodiments of the invention, the touch panel may include the touch sensing structure 30 directly formed on the phase retardation layer 20, so that the touch panel may have a reduced thickness because the touch panel may not need a base film having a large thickness of about 0.1 mm to about 0.5 mm for the touch sensor of the conventional touch panel. When the touch sensing structure 30 may be directly formed on the phase retardation layer 20 without any additional layer, the transmittance of light passing the touch panel may be increased while reducing the reflectivity of light generated from the display panel 10. Thus, the optical loss of the display device having the touch panel may be considerably reduced. Further, the touch panel according to example embodiments may have a simple configuration without any additional layers comparing to that of the conventional touch panel, such that the efficiency and yield of manufacturing process for the display panel may be greatly improved.

Referring now to FIG. 1, the polarization plate 35 may be disposed on the second face of the phase retardation layer 20 having the second sensing pattern 25 thereon. The polarization plate 35 may reduce the light reflection caused by external light to thereby improve the visibility of image displayed by the display panel 10. The polarization plate 35 may align the direction of light passing through the phase retardation layer 20. For example, the polarization plate 35 may pass one of the polarizing components of the incident light while the polarization plate 35 may absorb or distribute the other polarizing components of the incident light. The polarization plate 35 may include an iodine type polarizing film, a dye-based polarizing film, a polyene-based polarizing film, etc. In example embodiments, polarization plate 35 may have an absorption axis and a polarization axis. Here, the absorption axis may be a stretch-aligned optical axis that may include iodine ion chains or dichromic dyes. At the absorption axis of the polarization plate 35, the incident light may interact with electrons in the polarization plate 35, so that the energy of the incident light may converted into the energy of the electrons to there by extinct one of the polarizing components of the incident light. The polarization axis may be substantially perpendicular to the absorption axis. The other of the polarizing components of the incident light may pass through the polarization plate 35 along the polarization axis.

The window 45 may be disposed on the polarization plate 35. The adhesion layer 40 may be interposed between the polarization plate 35 and the window 45. The adhesion layer 40 may increase the combination strength between the polarization plate 35 and the window 45. The adhesion layer 40 may include rubber-based adhesive, acryl-based adhesive, vinylether-based adhesive, silicon-based adhesive, urethane-based adhesive, pressure sensitive adhesive, etc.

The window 45 may include a transparent material such as glass, quartz, transparent resin, etc. The window 45 may protect the display panel 10 and the underlying elements from external impact, moisture, particles, etc.

Figure 4:
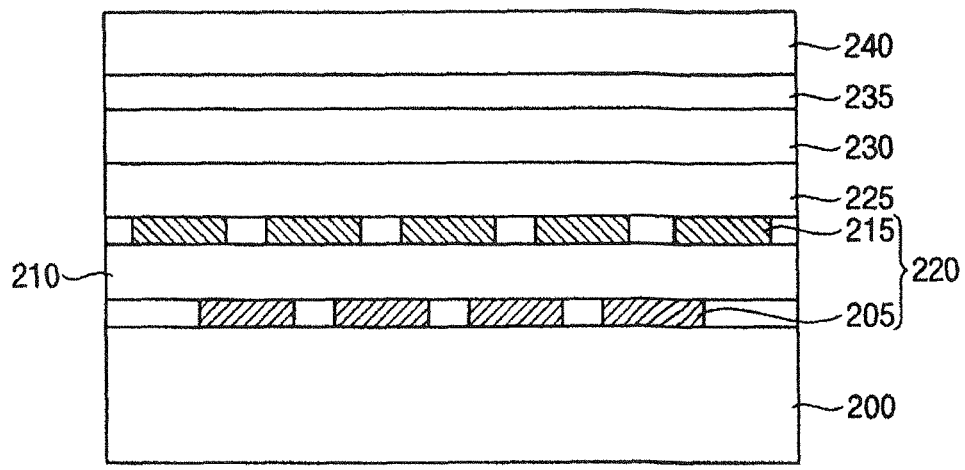
FIG. 4 is a cross sectional view illustrating a display device having a touch panel in accordance with some example embodiments.

Turning now to FIG. 4, FIG. 4 is a cross sectional view illustrating a display device having a touch panel in accordance with some example embodiments. The display device illustrated in FIG. 4 may have a construction substantially the same as or substantially similar to that of the display device described with reference to FIG. 1 except that the arrangement of FIG. 4 further includes a second phase retardation layer 225 in addition to a first phase retardation layer 210.

Referring now to FIG. 4, the display device may include a display panel 200 and a touch panel. The touch panel may include the first phase retardation layer 210, a touch sensing structure 220, the second phase retardation layer 225, a polarization plate 230, an adhesion layer 235, a window 240, etc.

A first sensing pattern 205 of the touch sensing structure 220 may be directly disposed on a first face of the first phase retardation layer 210 (e.g., a bottom face of the first phase retardation layer 210), and a second sensing pattern 215 of the touch sensing structure 220 may be directly formed on a second face of the first phase retardation layer 210 (e.g., an upper face of the first phase retardation layer 210). Alternatively, the second sensing pattern 215 may be directly arranged on a first face of the second phase retardation layer 225 (e.g., a bottom face of the second phase retardation layer 225).

In example embodiments, the touch sensing structure 220 having the first and the second sensing patterns 205 and 215 may be directly formed on the first phase retardation layer 210. In some example embodiments, the first sensing pattern 205 of the touch sensing structure 205 may be directly located on the first phase retardation layer 210 while the second sensing pattern 215 of the touch sensing structure 220 may be directly disposed on the second phase retardation layer 225. In this case, the first and the second sensing patterns 205 and 215 may have constructions substantially the same as or substantially similar to those of the first and the second sensing patterns 15 and 25 described with reference to FIG. 1, respectively.

In example embodiments, the first phase retardation layer 210 may include a $\lambda/4$ phase retardation film, and the second phase retardation layer 225 may include a $\lambda/2$ phase retardation film. An x-coordinate component and a y-coordinate component of light emitted from the display panel 200 may have a phase retardation of about $\lambda/4$ while passing through the first phase retardation layer 210. Hence, the first phase retardation layer 210 may change a circularly polarized component of light into a linearly polarized component of light, or the first phase retardation layer 210 may convert the linearly polarized component of light into the circularly polarized component. Additionally, the x-coordinate component and the y-coordinate component of light may have a phase retardation of about $\lambda/2$ while passing through the second phase retardation layer 225. Thus, the second phase retardation 225 may convert the linearly polarized component of light into the circularly component of light or an elliptically polarized component of light.

The polarization plate 230, the adhesive layer 235 and the window 240 may be sequentially disposed on the second phase retardation layer 225. The polarization plate 230, the adhesive layer 235 and the window 240 may have constructions substantially the same or substantially similar to those of the polarization plate 35, the adhesive layer 40 and the window 45 described with reference to FIG. 1, respectively.

Figure 5:
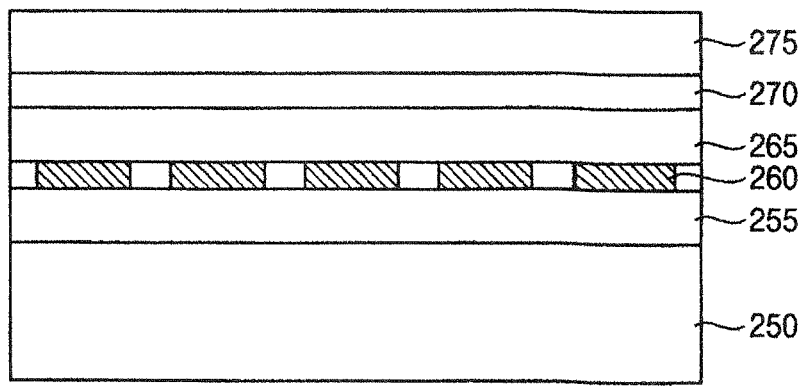
FIG. 5 is a cross sectional view illustrating a display device including a touch panel in accordance with some example embodiments.

Turning now to FIG. 5, FIG. 5 is a cross sectional view illustrating a display device including a touch panel in accordance with some example embodiments. In FIG. 5, the display device may have a construction substantially the same as or substantially similar to that of the display device described with reference to FIG. 1, except that two sensing patterns are not spaced apart from each other by another layer such as a phase retardation layer.

As illustrated in FIG. 5, the display device may include a touch panel disposed on a display panel 250 such as an organic light emitting display panel or a liquid crystal display panel. The touch panel may include a phase retardation layer 255, a touch sensing structure 260, a polarization plate 265, an adhesion layer 270, a window 275, etc.

In example embodiments, the phase retardation layer 255 may include a $\lambda/4$ phase retardation film. The phase retardation layer 255 may be disposed on the display panel 250. In some example embodiments, to increase adhesion strength between the display panel 250 and the phase retardation layer 255, an additional adhesion layer (not illustrated) may be disposed between the display panel 250 and the phase retardation layer 255.

The touch sensing structure 260 may be directly formed on the phase retardation layer 255. In example embodiments, the touch sensing structure 260 may include a plurality of sensing patterns which may have a construction substantially the same or substantially similar to one of the first and the second sensing pattern 15 and 25 described with reference to FIG. 3. In some example embodiments, the touch sensing structure 260 may have a plurality of sensing patterns having a combination structure of the first and the second sensing patterns 15 and 25 illustrated in FIG. 3. For example, the touch sensing structure 260 may include a plurality of sensing patterns that may have a first sensing pattern and a second sensing pattern alternately arranged on the phase retardation layer 255 along a row direction or a column direction.

The polarization plate 265, the adhesion layer 270 and the window 275 may be disposed on the phase retardation layer 255 having the touch sensing structure 260 thereon. Here, the polarization plate 265, the adhesion layer 270 and the window 275 may have constructions substantially the same as or substantially similar to those of the polarization plate 35, the adhesion layer 40 and the window 45 described with reference to FIG. 1.

Figure 6:
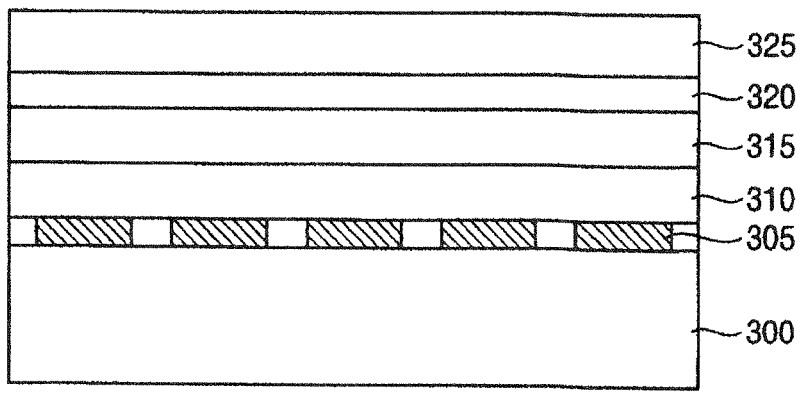
FIG. 6 is a cross sectional view illustrating a display device including a touch panel in accordance with some example embodiments.

Turning now to FIG. 6, FIG. 6 is a cross sectional view illustrating a display device including a touch panel in accordance with some example embodiments. The display device illustrated in FIG. 6 may have a construction substantially the same as or substantially similar to that of the display device described with reference to FIG. 5 except that the touch sensing structure is arranged on a bottom side of the phase retardation layer.

Referring now to FIG. 6, the display device may include a display panel 250 and a touch panel. The touch panel may include the touch sensing structure 305, a phase retardation layer 310, a polarization plate 315, an adhesion layer 320, a window 325, etc. Here, the polarization plate 315, the adhesion layer 320 and the window 325 may have constructions substantially the same as or substantially similar to those of the polarization plate 35, the adhesion layer 40 and the window 45 described with reference to FIG. 1.

The touch sensing structure 305 may be directly formed on one face of the phase retardation layer 310 substantially facing the display panel 300. In this case, the touch sensing structure 305 may include a plurality of sensing patterns which may have a construction substantially the same or substantially similar to one of the first and the second sensing patterns 15 and 25 described with reference to FIG. 3. Alternatively, the touch sensing structure 305 may have a plurality of sensing patterns having a combination structure of the first and the second sensing patterns 15 and 25 illustrated in FIG. 3. For example, the touch sensing structure 305 may include a plurality of sensing patterns that may have a first sensing pattern and a second sensing pattern alternately and repeatedly arranged on the phase retardation layer 255 along a row direction or a column direction without an intervening layer as in FIG. 1.

Figure 7:
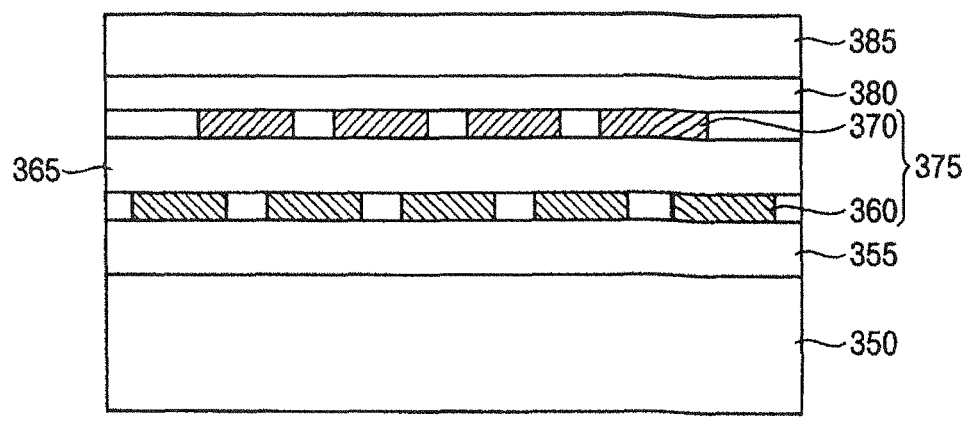
FIG. 7 is a cross sectional view illustrating a display device including a touch panel in accordance with some example embodiments.

Turning now to FIG. 7, FIG. 7 is a cross sectional view illustrating a display device including a touch panel in accordance with some example embodiments. The display device illustrated in FIG. 7 may have a construction substantially the same as or substantially similar to that of the display device described with reference to FIG. 1 except that the sensing patterns are arranged adjacent to each face of the polarization plate instead of each face of the phase retardation layer.

Referring now to FIG. 7, the display device may include a display panel 350 and a touch panel disposed on the display panel 350. The touch panel may include a phase retardation layer 355, a polarization layer 365, a touch sensing structure 375, an adhesion layer 380, a window 385, etc. In this case, the phase retardation layer 355, the polarization plate 365, the adhesion layer 380 and the window 385 may have constructions substantially the same as or substantially similar to those of the phase retardation layer 20, the polarization plate 35, the adhesion layer 40 and the window 45 described with reference to FIG. 1. In some example embodiments, an additional adhesion layer (not illustrated) may be interposed between the display panel 350 and the phase retardation layer 355 to enhance the adhesion strength between the display panel 350 and the touch panel.

The touch sensing structure 375 may include a first sensing pattern 360 disposed on the phase retardation layer 355 and a second sensing pattern 370 located on the polarization plate 365. In example embodiments, the first sensing pattern 360 may be directly formed on the phase retardation layer 355, and the second sensing pattern 370 may be directly formed on the polarization plate 365. Here, the first sensing pattern 360 may have a construction substantially the same or substantially similar to that of the first sensing pattern 15 described with reference to FIG. 3. Additionally, the second sensing pattern 370 may have a construction substantially the same or substantially similar to that of the second sensing pattern 35 described with reference to FIG. 3. Alternatively, the first and the second sensing patterns 360 and 370 may have constructions substantially the same or substantially similar to those of the second and the first sensing patterns 25 and 15 illustrated in FIG. 3, respectively.

Figure 8:
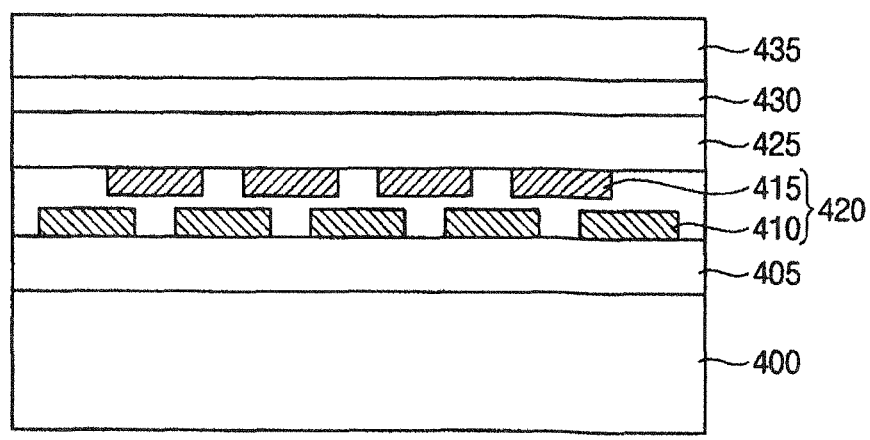
FIG. 8 is a cross sectional view illustrating a display device having a touch panel in accordance with some example embodiments.

Turning now to FIG. 8, FIG. 8 is a cross sectional view illustrating a display device having a touch panel in accordance with some example embodiments. In FIG. 8, the display device may have a construction substantially the same as or substantially similar to that of the display device described with reference to FIG. 1 except that both sensing patterns are adjacent to each other and arranged in between the phase retardation layer and the polarization plate.

As illustrated in FIG. 8, the display device may include a display panel 400 and a touch panel disposed on the display panel 400 such as an organic light emitting display panel or a liquid crystal display panel. The touch panel may include a phase retardation layer 405, a touch sensing structure 420 disposed on the phase retardation layer 405, a polarization plate 425 located on the touch sensing structure 420, an adhesion layer 430 positioned on the polarization plate 425, and a window 435 disposed on the adhesion layer 430, etc. Here, the phase retardation layer 405, the polarization plate 425, the adhesion layer 430 and the window 435 may have constructions substantially the same as or substantially similar to those of the phase retardation layer 20, the polarization plate 35, the adhesion layer 40 and the window 45 described with reference to FIG. 1. Further, an additional adhesion layer (not illustrated) may be interposed between the display panel 400 and the phase retardation layer 405 to enhance the combination strength between the display panel 400 and the touch panel.

In example embodiments, the touch sensing structure 420 may include a first sensing pattern 410 disposed on an upper face of the phase retardation layer 405 and a second sensing pattern 415 positioned on a bottom face of the polarization plate 425. In this case, the first and the second sensing patterns 410 and 415 may have constructions substantially the same or substantially similar to those of the second and the first sensing patterns 25 and 15 described with reference to FIG. 3. In some example embodiments, the first and the second sensing patterns 410 and 415 may have constructions substantially the same or substantially similar to those of the first and the second sensing patterns 15 and 25 illustrated in FIG. 3, respectively.

Figure 9:
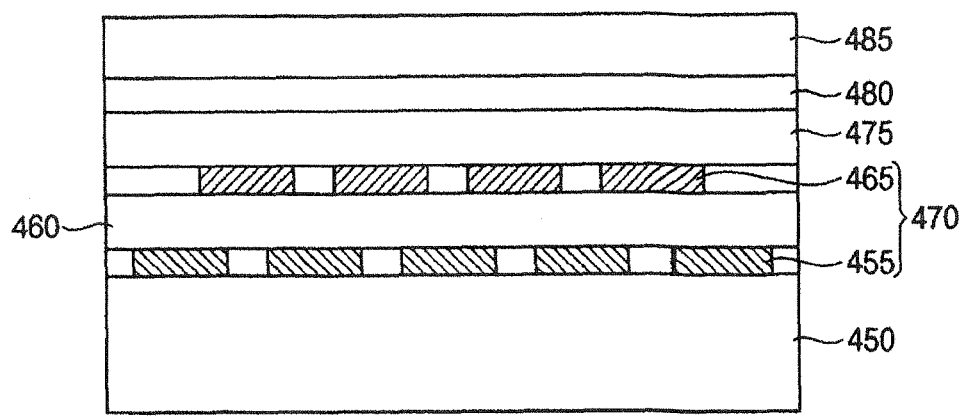
FIG. 9 is a cross sectional view illustrating a display device including a touch panel in accordance with some example embodiments.

Turning now to FIG. 9, FIG. 9 is a cross sectional view illustrating a display device including a touch panel in accordance with some example embodiments. The display device illustrated in FIG. 9 may have a construction substantially the same as or substantially similar to that of the display device described with reference to FIG. 1 except that the first and second sensing patterns are switched.

As illustrated in FIG. 9, the display device may include a touch panel combined with a display panel 450, and the touch panel may include the touch sensing structure 470, a phase retardation layer 460, a polarization plate 475, an adhesion layer 480, a window 485, etc. In FIG. 4, the phase retardation layer 460, the polarization plate 475, the adhesion layer 480 and the window 485 may have constructions substantially the same as or substantially similar to those of the polarization plate 35, the adhesion layer 40 and the window 45 described with reference to FIG. 1.

The touch sensing structure 470 may include a first sensing pattern 455 and a second sensing pattern 465 directly formed on a bottom face and an upper face of the phase retardation layer 460, respectively. The first and the second sensing patterns 455 and 465 which may have constructions respectively substantially the same or substantially similar to those of the second and the first sensing patterns 25 and 15 described with reference to FIG. 3. In some example embodiments, the first sensing pattern 455 may be directly formed on the bottom face of the phase retardation layer 460 whereas the second sensing pattern 465 may be directly formed on the bottom face of the polarization plate 475. For example, the first and the second patterns 455 and 465 may be formed by a printing process, a spraying process, a vacuum evaporation process, a sputtering process, a PLD process, etc.

Figure 10:
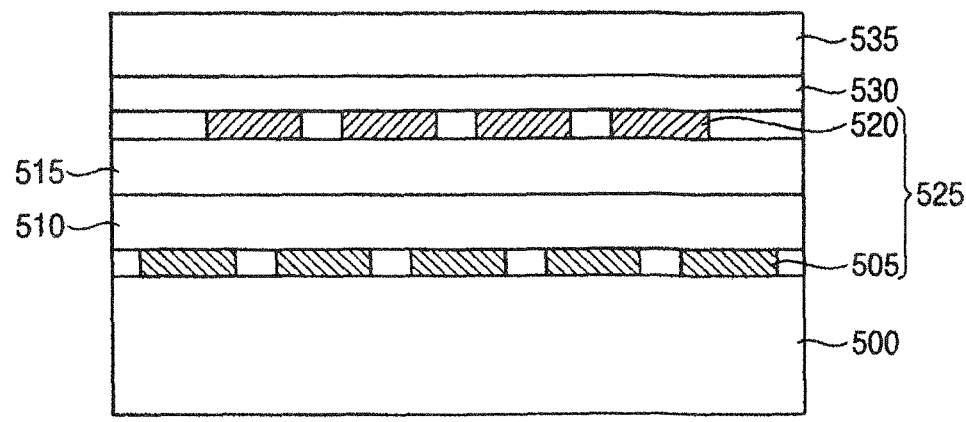
FIG. 10 is a cross sectional view illustrating a display device including a touch panel in accordance with some example embodiments.

Turning now to FIG. 10, FIG. 10 is a cross sectional view illustrating a display device including a touch panel in accordance with some example embodiments. The display device illustrated in FIG. 10 may have a construction substantially the same as or substantially similar to that of the display device described with reference to FIG. 1 except that the second sensing pattern is arranged on top of the polarization plate instead of on top of the phase retardation layer.

Referring now to FIG. 10, the display device may include a display panel 500 and a touch panel disposed on the display panel 500. The touch panel may include the touch sensing structure 525, a phase retardation layer 510, a polarization plate 515, an adhesion layer 530, a window 535, etc. A first sensing pattern 505 of the touch sensing structure 525 may be directly disposed on a bottom face of the phase retardation layer 510, and a second sensing pattern 520 of the touch sensing structure 525 may be directly formed on an upper face of the polarization plate 515. Thus, the polarization plate 515 may directly contact the phase retardation layer 510. The first and the second sensing patterns 505 and 520 may have constructions substantially the same or substantially similar to one of the second and the first sensing patterns 25 and 15 described with reference to FIG. 3, respectively.

According to example embodiments of the invention, the touch panel may include the touch sensing structure 525 having the first and the second sensing patterns 505 and 520 directly formed on the phase retardation layer 510 and the polarization plate 515, so that the touch panel may have a reduced thickness without any base film having a large thickness. Further, the loss of light emitted from the display panel 500 may be decreased because the sensing structure 525 may be directly disposed on the phase retardation layer 510 and the polarization plate 515.

Figure 11:
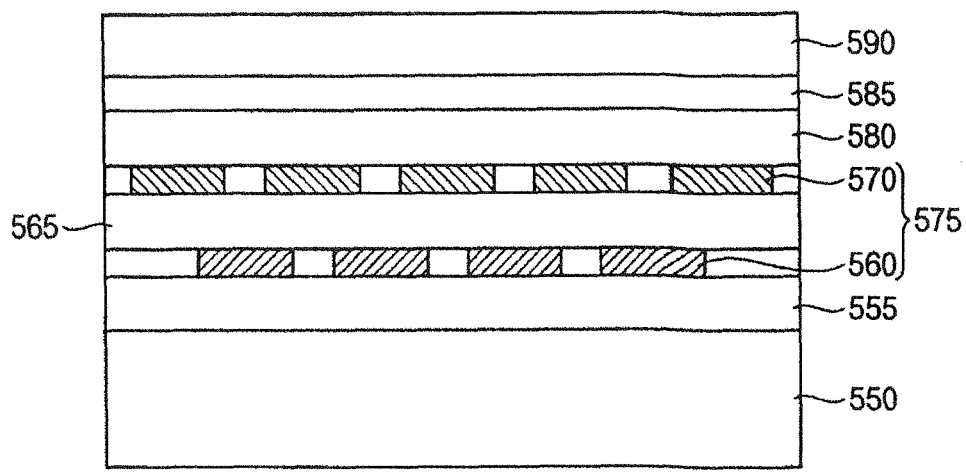
FIG. 11 is a cross sectional view illustrating a display device having a touch panel in accordance with some example embodiments.

Turning now to FIG. 11, FIG. 11 is a cross sectional view illustrating a display device having a touch panel in accordance with some example embodiments. The display device illustrated in FIG. 11 may have a construction substantially the same as or substantially similar to that of the display device described with reference to FIG. 1 except that an additional phase retardation layer 555 is included and is located beneath the first sensing pattern.

Referring now to FIG. 11, the display device may include a display panel 550 and a touch panel. The touch panel may include a first phase retardation layer 555, a second phase retardation layer 565, the touch sensing structure 575 having first and second sensing patterns 560 and 570, a polarization plate 580, an adhesion layer 585, a window 590, etc. The first and the second phase retardation layers 555 and 565 may have constructions substantially the same or substantially similar to those of the first and the second phase retardation layers 210 and 225 described with reference to FIG. 4. Additionally, the polarization plate 580, the adhesion layer 585 and the window 590 may have constructions substantially the same as or substantially similar to those of the polarization plate 35, the adhesion layer 40 and the window 45 described with reference to FIG. 1.

In example embodiments, the first sensing pattern 560 of the touch sensing structure 575 may be directly disposed on an upper face of the first phase retardation layer 555 while being directly formed on a bottom face of the second retardation layer 565. The second sensing pattern 570 of the touch sensing structure 575 may be directly located on an upper face of the second phase retardation layer 565 while being also arranged on the bottom face of the polarization plate 580. The first and second sensing patterns 560 and 570 may have constructions substantially the same or substantially similar to those of the first and the second sensing patterns 15 and 25 described with reference to FIG. 3, respectively.

Figure 12:
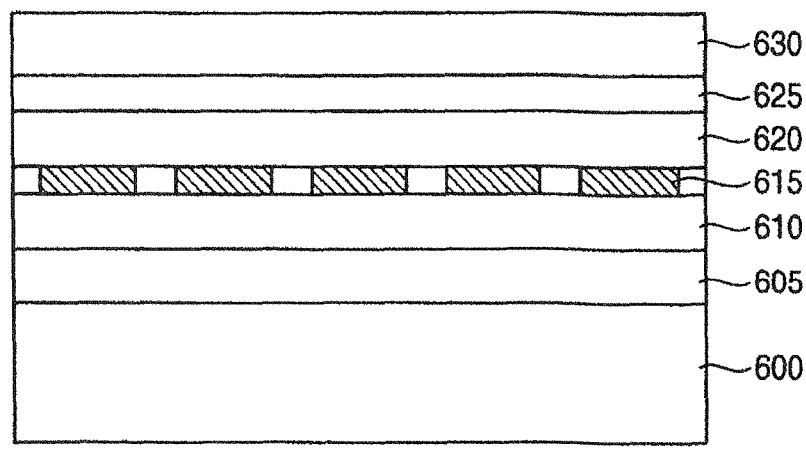
FIG. 12 is a cross sectional view illustrating a display device including a touch panel in accordance with some example embodiments.

Turning now to FIG. 12, FIG. 12 is a cross sectional view illustrating a display device including a touch panel in accordance with some example embodiments. In FIG. 12, the display device may have a construction substantially the same as or substantially similar to that of the display device described with reference to FIG. 4 except that the touch sensing structure 615 is formed only on top of second phase retardation layer 610.

Referring to FIG. 12, the display device may include a display panel 600 and a touch panel combined with the display panel 600. The touch panel may include a first phase retardation layer 605, a second phase retardation layer 610, the touch sensing structure 615, a polarization plate 620, an adhesion layer 625, a window 630, etc. In this case, the first and the second phase retardation layers 605 and 610 may have constructions substantially the same as or substantially similar to those of the first and the second phase retardation layers 210 and 225 described with reference to FIG. 4. Further, the polarization plate 620, the adhesion layer 625 and the window 630 may have constructions substantially the same as or substantially similar to those of the polarization plate 35, the adhesion layer 40 and the window 45 described with reference to FIG. 1.

Figure 15:
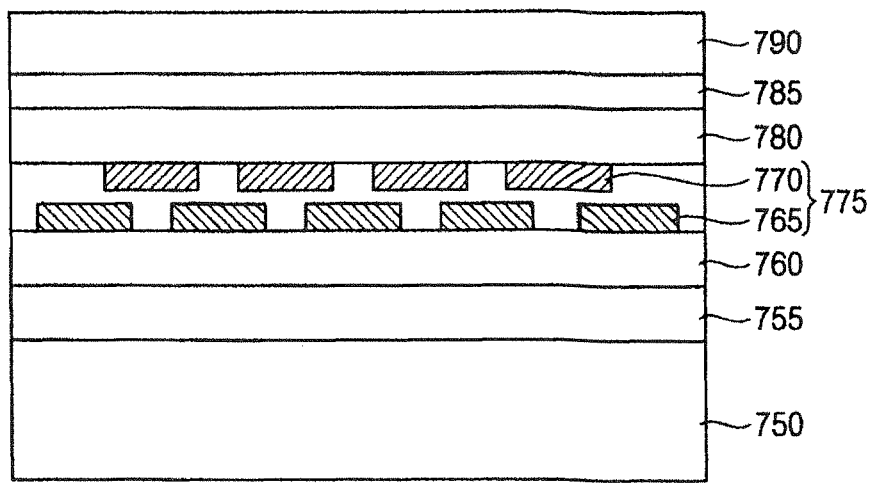
FIG. 15 is a cross sectional view illustrating a display device having a touch panel in accordance with some example embodiments.

In example embodiments, the touch sensing structure 615 may be directly formed on an upper face of the second phase retardation layer 610 or may be directly disposed on a bottom face of the polarization plate 620. Here, the touch sensing structure 615 may include a plurality of sensing patterns having constructions substantially the same or substantially similar to one of the first and the second sensing patterns 15 and 25 described with reference to FIG. 3. Alternatively, the touch sensing structure 615 may have a plurality of sensing patterns having a combination structure of the first and the second sensing patterns 15 and 25 illustrated in FIG. 3 and as illustrated in FIG. 15. For example, the touch sensing structure 615 may include a plurality of sensing patterns that may have a first sensing pattern and a second sensing pattern alternately disposed on the second phase retardation layer 610 or the polarization plate 620 along a row direction or a column direction.

Figure 13:
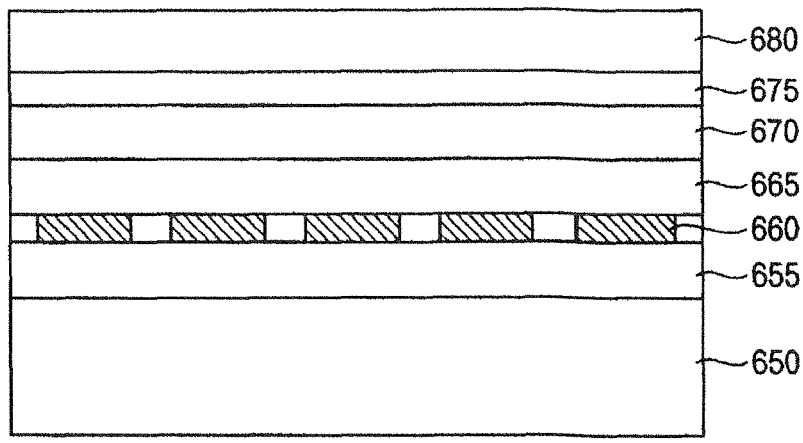
FIG. 13 is a cross sectional view illustrating a display device having a touch panel in accordance with some example embodiments.

Turning now to FIG. 13, FIG. 13 is a cross sectional view illustrating a display device having a touch panel in accordance with some example embodiments. The display device illustrated in FIG. 13 may have a construction substantially the same as or substantially similar to that of the display device described with reference to FIG. 12 except that the touch sensing structure 660 is arranged between the two phase retardation layers and not on top of them.

Referring now to FIG. 13, the display device may include a display panel 650 and a touch panel combined with the display panel 650, for example, an organic light emitting display panel, a liquid crystal display panel, a plasma display panel, etc. The touch panel may include a first phase retardation layer 655, the touch sensing structure 660, a second phase retardation layer 665, a polarization plate 670, an adhesion layer 675, a window 680, etc. The first and the second phase retardation layers 655 and 665 may have constructions substantially the same as or substantially similar to those of the first and the second phase retardation layers 210 and 225 described with reference to FIGS. 4 and 605 and 610 of FIG. 12. Additionally, the polarization plate 670, the adhesion layer 675 and the window 680 may have constructions substantially the same as or substantially similar to those of the polarization plate 35, the adhesion layer 40 and the window 45 described with reference to FIG. 1.

In example embodiments, the touch sensing structure 660 may be directly formed on an upper face of the first phase retardation layer 655, or may be directly disposed on a bottom face of the second phase retardation layer 665. Here, the touch sensing structure 660 may have a construction substantially the same or substantially similar to that of the touch sensing structure 260 described with reference to FIG. 5.

Figure 14:
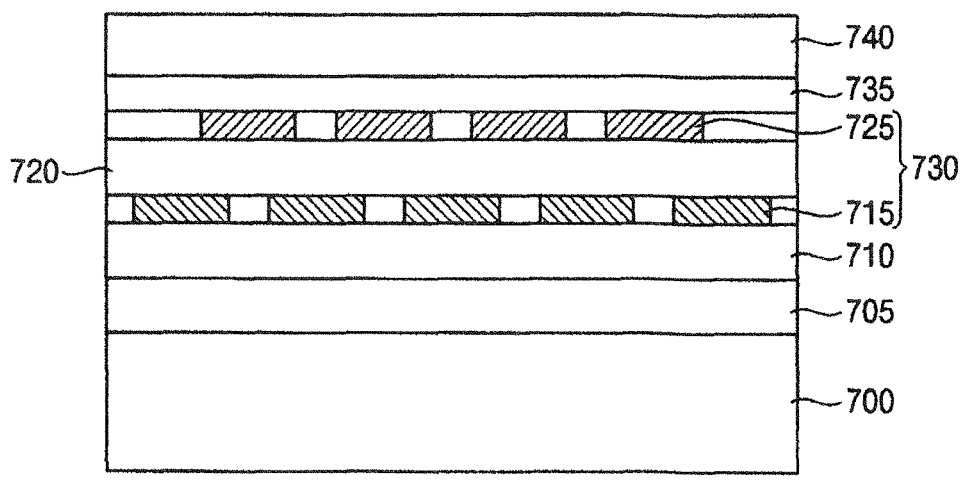
FIG. 14 is a cross sectional view illustrating a display device including a touch panel in accordance with some example embodiments.

Turning now to FIG. 14, FIG. 14 is a cross sectional view illustrating a display device including a touch panel in accordance with some example embodiments. The display device illustrated in FIG. 14 may have a construction substantially the same as or substantially similar to that of the display device described with reference to FIG. 4 except that the sensing patterns are arranged about a polarization plate and not the first phase retardation layer.

Referring to FIG. 14, the display device may include a display panel 700 and a touch panel. The touch panel may include a first phase retardation layer 705, a second phase retardation layer 710, the touch sensing structure 730, a polarization plate 720, an adhesion layer 735, a window 740, etc. The first and the second phase retardation layers 705 and 710 may have constructions substantially the same as or substantially similar to the first and the second phase retardation layers 210 and 225 described with reference to FIG. 4, respectively. Further, the polarization plate 720, the adhesion layer 735 and the window 740 may have constructions substantially the same as or substantially similar to the polarization layer 35, the adhesion layer 40 and the window 45 described with reference to FIG. 1.

In FIG. 14, the touch sensing structure 730 may include a first sensing pattern 715 and a second sensing pattern 725. The first sensing pattern 715 may be directly disposed on an upper face of the second phase retardation layer 710 or a lower face of the polarization plate 720. The second sensing pattern 725 may be directly formed on an upper face of the polarization plate 720. The first and the second sensing patterns 715 and 725 may have constructions substantially the same as or substantially similar to those of the second and the first sensing patterns 25 and 15 described with reference to FIG. 3.

Turning now to FIG. 15, FIG. 15 is a cross sectional view illustrating a display device having a touch panel in accordance with some example embodiments. In FIG. 15, the display device may have a construction substantially the same as or substantially similar to that of the display device described with reference to FIG. 8 except the inclusion of the second phase retardation layer on the first phase retardation layer.

Referring now to FIG. 15, the display device may include a display panel 750 and a touch panel combined with the display panel 750, the display panel being an organic light emitting display panel, a liquid crystal display panel, a plasma display panel, an electrophoretic display panel, etc. The touch panel may include a first phase retardation layer 755, a second phase retardation layer 760, the touch sensing structure 775, a polarization plate 780, an adhesion layer 785, a window 790, etc. The first and the second phase retardation layers 755 and 760 may have constructions substantially the same or substantially similar to those of the first and the second phase retardation layers 210 and 225 described with reference to FIG. 4. Additionally, the polarization plate 780, the adhesion layer 785 and the window 790 may have constructions substantially the same as or substantially similar to those of the polarization plate 35, the adhesion layer 40 and the window 45 described with reference to FIG. 1.

In FIG. 15, the touch sensing structure 775 may include a first sensing pattern 765 and a second sensing pattern 770. The first sensing pattern 765 may be directly formed on an upper face of the second phase retardation layer 760, and the second sensing pattern 770 may be directly disposed on a bottom face of the polarization plate 780. Here, the first and the second sensing patterns 765 and 770 may have constructions substantially the same as or substantially similar to those of the second and the first sensing patterns 25 and 15 described with reference to FIG. 3, respectively.

Figure 16:
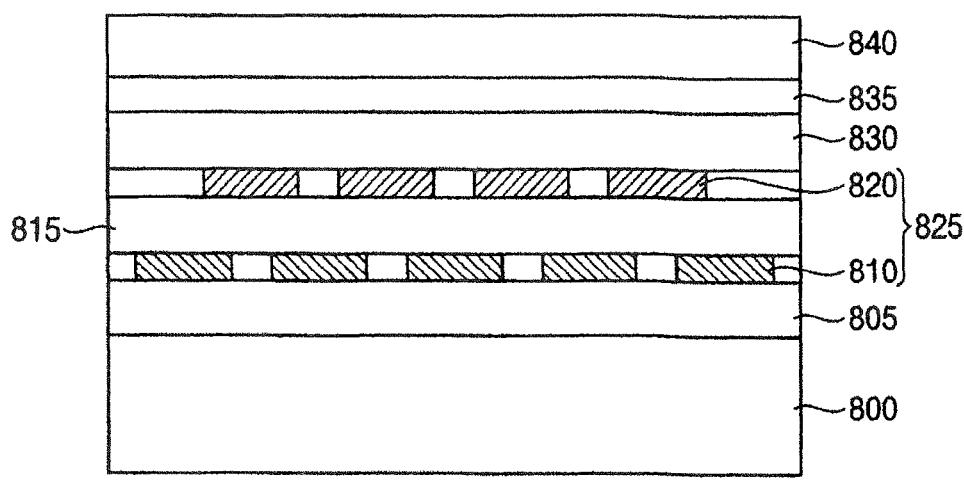
FIG. 16 is a cross sectional view illustrating a display device including a touch panel in accordance with some example embodiments.

Turning now to FIG. 16, FIG. 16 is a cross sectional view illustrating a display device including a touch panel in accordance with some example embodiments. The display device illustrated in FIG. 16 may have a construction substantially the same as or substantially similar to that of the display device described with reference to FIG. 1 except that an additional phase retardation layer 805 is arranged between the display panel 800 and the touch sensing structure 825.

As illustrated in FIG. 16, the display device may include a display panel 800 and a touch panel. The touch panel may include the first phase retardation layer 805, the touch sensing structure 825, the second phase retardation layer 815, a polarization plate 830, an adhesion layer 835, a window 840, etc. The first and the second phase retardation layers 805 and 815 may have constructions substantially the same or substantially similar to those of the first and the second phase retardation layers 210 and 225 described with reference to FIG. 4. In some example embodiments, the touch panel may include an additional adhesion layer (not illustrated) located between the display panel 800 and the first phase retardation layer 805. Further, the polarization plate 830, the adhesion layer 835 and the window 840 may have constructions substantially the same as or substantially similar to those of the polarization plate 35, the adhesion layer 40 and the window 45 described with reference to FIG. 1.

In FIG. 16, the touch sensing structure 825 may include first and second sensing patterns 810 and 820. The first sensing pattern 810 may be directly positioned on an upper face of the first phase retardation layer 805 or a bottom face of the second phase retardation layer 815. The second sensing pattern 820 may be directly formed on an upper face of the second phase retardation layer 815 or on a bottom face of the polarization plate 830. The first and the second sensing patterns 810 and 820 may have constructions substantially the same or substantially similar to one of the second and the first sensing patterns 25 and 15 described with reference to FIG. 3.

Figure 17:
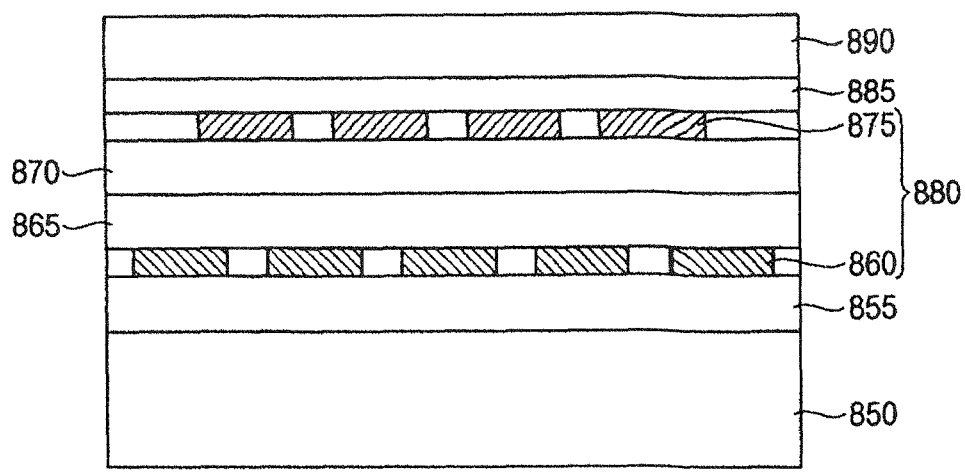
FIG. 17 is a cross sectional view illustrating a display device having a touch panel in accordance with some example embodiments.

Turning now to FIG. 17, FIG. 17 is a cross sectional view illustrating a display device having a touch panel in accordance with some example embodiments. The display device illustrated in FIG. 17 may have a construction substantially the same as or substantially similar to that of the display device described with reference to FIG. 4 with the exception that one of the sensing patterns is arranged on top of the polarization plate instead of underneath the first phase retardation layer.

Referring now to FIG. 17, the display device may include a touch panel and a display panel 850. The touch panel may include a first phase retardation layer 855, the touch sensing structure 880, a second phase retardation layer 865, a polarization plate 870, an adhesion layer 885, a window 890, etc. Here, the first and the second phase retardation layers 855 and 865 may have constructions substantially the same or substantially similar to those of the first and the second phase retardation layers 210 and 225 described with reference to FIG. 4. In some example embodiments, the touch panel may further include an additional adhesion layer (not illustrated) located between the display panel 850 and the first phase retardation layer 855. Further, the polarization plate 870, the adhesion layer 885 and the window 890 may have constructions substantially the same as or substantially similar to those of the polarization plate 35, the adhesion layer 40 and the window 45 described with reference to FIG. 1.

In FIG. 17, the first sensing pattern 860 of the touch sensing structure 880 may be directly formed on an upper face of the first phase retardation layer 855 or a bottom face of the second phase retardation layer 865. The second sensing pattern 875 of the touch sensing structure 880 may be directly formed on an upper face of the polarization plate 870. The first and the second sensing patterns 860 and 875 may have constructions substantially the same or substantially similar to those of the second and the first sensing patterns 25 and 15 described with reference to FIG. 3.

Figure 18:
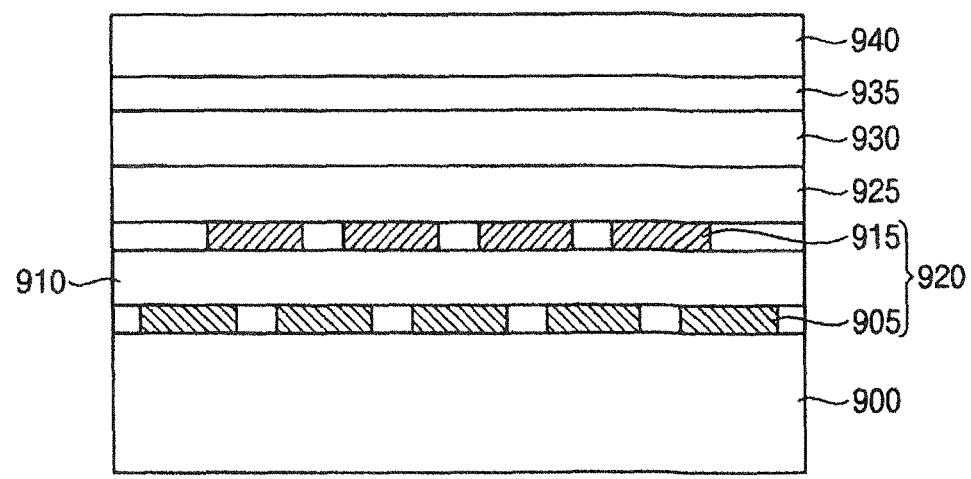
FIG. 18 is a cross sectional view illustrating a display device including a touch panel in accordance with some example embodiments.

Turning now to FIG. 18, FIG. 18 is a cross sectional view illustrating a display device including a touch panel in accordance with some example embodiments. The display device illustrated in FIG. 18 may have a construction substantially the same as or substantially similar to that of the display device described with reference to FIG. 4 except the first and second sensing patterns are switched.

Referring to FIG. 18, the display device may include a display panel 900 and a touch panel. The touch panel may include the touch sensing structure 920 having first and second sensing patterns 905 and 915, a first phase retardation layer 910, a second phase retardation layer 925, a polarization plate 930, an adhesion layer 935, a window 940, etc.

In the touch sensing structure 920 according to example embodiments, the first sensing pattern 905 may be directly formed on a bottom face of the first phase retardation layer 910. The second sensing pattern 915 may be directly positioned on an upper face of the first phase retardation layer 910 or a bottom face of the second phase retardation layer 925. In this case, the first and the second sensing pattern 905 and 915 have constructions substantially the same or substantially similar to those of the second and the first sensing pattern 25 and 15 described with reference to FIG. 3, respectively.

Figure 19:
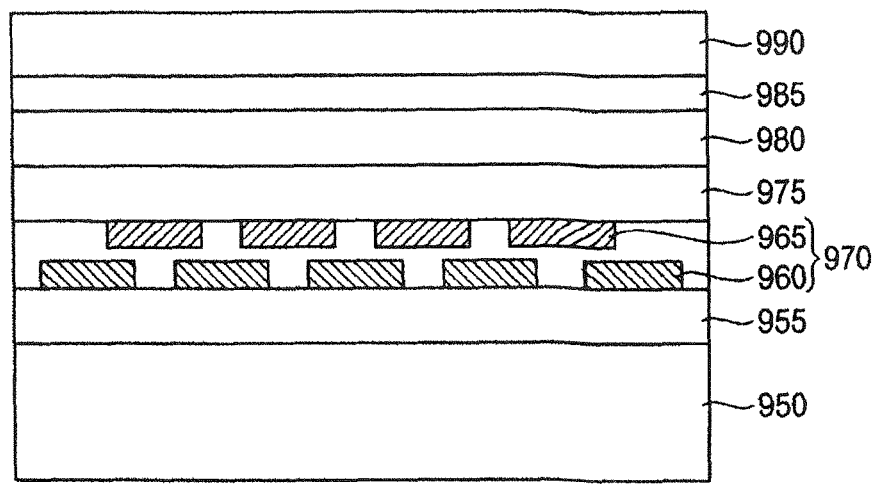
FIG. 19 is a cross sectional view illustrating a display device including a touch panel in accordance with some example embodiments.

Turning now to FIG. 19, FIG. 19 is a cross sectional view illustrating a display device including a touch panel in accordance with some example embodiments. In FIG. 19, the display device may have a construction substantially the same as or substantially similar to that of the display device described with reference to FIG. 4 except that both sensing patterns of the touch sensing structure 970 are arranged between the two phase retardation layers.

As illustrated in FIG. 19, the display device may include a display panel 950 and a touch panel. The touch panel may include a first phase retardation layer 955, the touch sensing structure 970 having first and second sensing patterns 960 and 965, a second phase retardation layer 975, a polarization plate 980, an adhesion layer 985, a window 990, etc.

As for the touch sensing structure 970 according to example embodiments, the first sensing pattern 960 may be directly disposed on a top face of the first phase retardation layer 955, and the second sensing pattern 965 may be directly formed on a bottom face of the second phase retardation layer 975. Here, the first and the second sensing patterns 960 and 965 may have constructions substantially the same or substantially similar to those of the second and the first sensing patterns 25 and 15 described with reference to FIG. 3, respectively.

Figure 20:
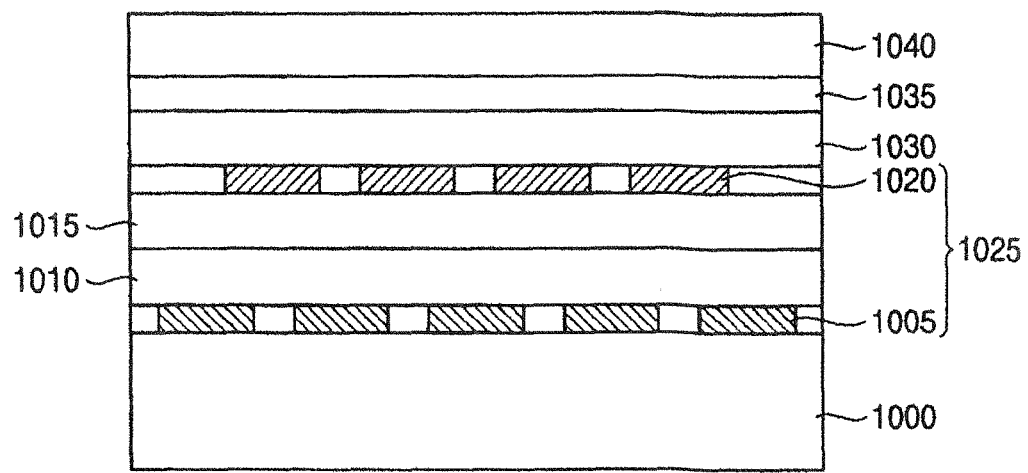
FIG. 20 is a cross sectional view illustrating a display device having a touch panel in accordance with some example embodiments.

Turning now to FIG. 20, FIG. 20 is a cross sectional view illustrating a display device having a touch panel in accordance with some example embodiments. The display device illustrated in FIG. 20 may have a construction substantially the same as or substantially similar to that of the display device described with reference to FIG. 4 except that the second sensing pattern 1020 is arranged on top of and not beneath the second phase retardation layer 1015.

Referring now to FIG. 20, the display device may include a display panel 1000 and a touch panel combined with the display panel 1000, for example, an organic light emitting display panel, a liquid crystal display panel, etc. The touch panel may include the touch sensing structure 1025 having first and second sensing patterns 1005 and 1020, the first phase retardation layer 1010, the second phase retardation layer 1015, a polarization plate 1030, an adhesion layer 1035, a window 1040, etc.

In the touch sensing structure 1025 according to example embodiments, the first sensing pattern 1005 may be directly formed on a bottom face of the first phase retardation layer 1010. The second sensing pattern 1020 may be directly disposed on an upper face of the second phase retardation layer 1015 or on a bottom face of the polarization layer 1030. The first and the second sensing patterns 1005 and 1020 may have constructions substantially the same as or substantially similar to those of the second and the first sensing patterns 25 and 15 described with reference to FIG. 3, respectively.

Figure 21:
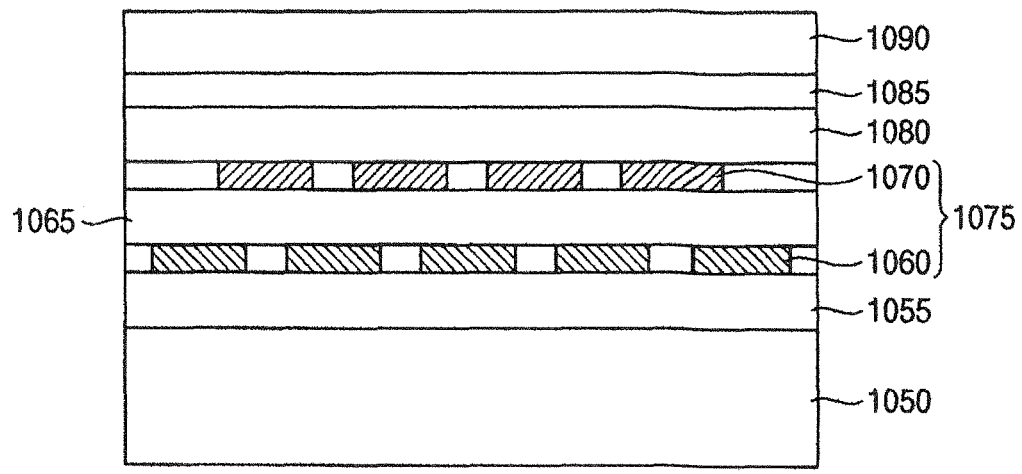
FIG. 21 is a cross sectional view illustrating a display device having a touch panel in accordance with some example embodiments.

Turning now to FIG. 21, FIG. 21 is a cross sectional view illustrating a display device having a touch panel in accordance with some example embodiments. In FIG. 21, the display device may have a construction substantially the same as or substantially similar to that of the display device described with reference to FIG. 4 except a touch sensing structure 1075.

Referring to FIG. 21, the display device may include a display panel 1050 and a touch panel combined with the display panel 1050, for example, an organic light emitting display panel, a liquid crystal display panel, a plasma display panel, an electrophoresis image display panel, etc. The touch panel may include a first phase retardation layer 1055, the touch sensing structure 1075 having first and second sensing patterns 1060 and 1070, a second phase retardation layer 1065, a polarization plate 1080, an adhesion layer 1085, a window 1090, etc. The first and the second phase retardation layers 1055 and 1065 may have constructions substantially the same as or substantially similar to those of the first and the second phase retardation layers 210 and 225 described with reference to FIG. 4. In some example embodiments, an additional adhesion layer (not illustrated) may be disposed between the display panel 1050 and the touch panel. The polarization plate 1080, the adhesion layer 1085 and the window 1090 may have constructions substantially the same as or substantially similar to those of the polarization 35, the adhesion layer 40 and the window 45 described with reference to FIG. 1.

In the touch sensing structure 1075 according to example embodiments, the first sensing pattern 1060 may be directly formed on an upper face of the first phase retardation layer 1055 or on a bottom face of the second phase retardation layer 1065. The second sensing pattern 1070 may be directly formed on an upper face of the second phase retardation layer 1065 or on a bottom face of the polarization plate 1080. The first and the second sensing patterns 1060 and 1070 may have constructions substantially the same as or substantially similar to one of the second and the first sensing patterns 25 and 15 described with reference to FIG. 3, respectively.

According to example embodiments of the invention, a display device may include a display panel and a touch panel having a touch sensing structure directly formed on at least one phase retardation layer and/or a polarization layer, so that the display device may have a considerably small thickness by reducing a thickness of the touch panel. Additionally, failures of manufacturing processes such as particles or strains may be prevented in manufacturing the display device because the touch panel may not require any additional base film for the touch sensing structure. Furthermore, the display device including the touch panel may reduce the loss of light generated from the display panel by increasing the transmittance of the light passing through the touch panel having a simplified structure. As a result, the display device may ensure a slim thickness and the quality of image displayed by the display device may increase.

The foregoing is illustrative of example embodiments, and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims. The invention is defined by the following claims, with equivalents of the claims to be included therein.

What is claimed is:

1. A touch panel, comprising:
   a first phase retardation layer;
   a second phase retardation layer arranged on the first phase retardation layer; and
   a touch sensing structure including a plurality of first sensing patterns arranged directly on a bottom face of the first phase retardation layer and a plurality of second sensing patterns arranged directly on an upper face of the first phase retardation layer;
   a polarization plate arranged on the touch sensing structure;
   an adhesion layer arranged on the polarization plate; and
   a window arranged on the adhesion layer.

2. The touch panel of claim 1, wherein the first phase retardation layer includes a $\lambda/4$ phase retardation film and the second phase retardation layer includes a $\lambda/2$ phase retardation film.

3. A touch panel, comprising:
   a first phase retardation layer;
   a second phase retardation layer arranged on the first phase retardation layer;
   a touch sensing structure including a plurality of first sensing patterns arranged directly on a bottom face of the second phase retardation layer and a plurality of second sensing patterns arranged directly on an upper face of the second phase retardation layer;
   a polarization plate arranged on the touch sensing structure;
   an adhesion layer arranged on the polarization plate; and
   a window arranged on the adhesion layer.

4. A display device comprising a touch panel arranged on a display panel, the touch panel comprising:
   at least one phase retardation layer;
   a polarization plate arranged on the at least one phase retardation layer;
   a touch sensing structure including a plurality of first sensing patterns arranged directly on a bottom face of the at least one phase retardation layer, and a plurality of second sensing patterns arranged directly on a bottom face of the polarization plate;
   an adhesion layer arranged on the polarization plate; and
   a window arranged on the adhesion layer.

5. The display device of claim 4, wherein the at least one phase retardation layer comprises:
   a first phase retardation layer having a $\lambda/4$ phase retardation film; and
   a second phase retardation layer having a $\lambda/2$ phase retardation film, the second phase retardation layer being arranged on the first phase retardation layer.

* * * * *